US008748899B2

(12) United States Patent
Yokogawa et al.

(10) Patent No.: US 8,748,899 B2
(45) Date of Patent: Jun. 10, 2014

(54) NITRIDE-BASED SEMICONDUCTOR DEVICE AND METHOD FOR FABRICATING THE SAME

(75) Inventors: Toshiya Yokogawa, Nara (JP); Mitsuaki Oya, Osaka (JP); Atsushi Yamada, Osaka (JP); Ryou Kato, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/447,368

(22) Filed: Apr. 16, 2012

(65) Prior Publication Data

US 2012/0199844 A1    Aug. 9, 2012

Related U.S. Application Data

(63) Continuation of application No. PCT/JP2010/007400, filed on Dec. 21, 2010.

(30) Foreign Application Priority Data

Dec. 25, 2009  (JP) ................................. 2009-294617

(51) Int. Cl.
*H01L 29/778*   (2006.01)
*H01L 33/32*    (2010.01)
*H01L 29/78*    (2006.01)

(52) U.S. Cl.
USPC ................... 257/76; 257/13; 257/77; 257/98; 436/46; 438/478

(58) Field of Classification Search
USPC .................................................... 257/77, 76
See application file for complete search history.

(56) References Cited

U.S. PATENT DOCUMENTS 5,708,301 A    1/1998  Iyechika et al.
5,990,500 A *  11/1999 Okazaki .......................... 257/99

(Continued)

FOREIGN PATENT DOCUMENTS

JP    07-011429    1/1995
JP    07-011430    1/1995

(Continued)

OTHER PUBLICATIONS

Nakamura et al, "Thermal Annealing Effects on P-Type Mg-Doped GaN Films", Japanese Journal of Applied Physics, vol. 31, (1992) pp. L 139-L 142, Part 2, No. 2B, Feb. 15, 1992.*

(Continued)

*Primary Examiner* — Hsien Ming Lee
*Assistant Examiner* — Charles N Ausar-El
(74) *Attorney, Agent, or Firm* — Renner, Otto, Boisselle & Sklar, LLP

(57) ABSTRACT

A nitride-based semiconductor device according to the present disclosure includes a nitride-based semiconductor multilayer structure 20 with a p-type semiconductor region, of which the surface 12 defines a tilt angle of one to five degrees with respect to an m plane, and an electrode 30, which is arranged on the p-type semiconductor region. The p-type semiconductor region is made of an $Al_xIn_yGa_zN$ (where $x+y+z=1$, $x \geq 0$, $y \geq 0$ and $z \geq 0$) semiconductor layer 26. The electrode 30 includes an Mg layer 32, which is in contact with the surface 12 of the p-type semiconductor region, and a metal layer 34 formed on the Mg layer 32. The metal layer 34 is formed from at least one metallic element that is selected from the group consisting of Pt, Mo and Pd.

27 Claims, 22 Drawing Sheets

(56) References Cited

U.S. PATENT DOCUMENTS

| | | | |
|---|---|---|---|
| 6,072,197 A | 6/2000 | Horino et al. | |
| 6,303,405 B1 * | 10/2001 | Yoshida et al. | 438/46 |
| 6,720,584 B2 * | 4/2004 | Hata et al. | 257/98 |
| 7,064,357 B2 * | 6/2006 | Ueta et al. | 257/103 |
| 7,235,818 B2 * | 6/2007 | Kim et al. | 257/98 |
| 7,352,012 B2 * | 4/2008 | Ueta et al. | 257/103 |
| 7,547,908 B2 * | 6/2009 | Grillot et al. | 257/11 |
| 7,663,158 B2 * | 2/2010 | Ueta et al. | 257/103 |
| 7,714,350 B2 * | 5/2010 | Sugawara et al. | 257/102 |
| 7,964,425 B2 * | 6/2011 | Lee | 438/45 |
| 8,058,639 B2 * | 11/2011 | Inoue et al. | 257/13 |
| 8,110,851 B2 * | 2/2012 | Yokogawa et al. | 257/103 |
| 8,124,986 B2 * | 2/2012 | Anzue et al. | 257/79 |
| 2002/0146856 A1 * | 10/2002 | Morita | 438/46 |
| 2003/0203629 A1 * | 10/2003 | Ishibashi et al. | 438/689 |
| 2005/0142820 A1 * | 6/2005 | Kim | 438/516 |
| 2005/0145875 A1 | 7/2005 | Kim et al. | |
| 2006/0081867 A1 | 4/2006 | Kim et al. | |
| 2008/0179607 A1 * | 7/2008 | DenBaars et al. | 257/94 |
| 2008/0230766 A1 * | 9/2008 | Okamoto et al. | 257/13 |
| 2008/0251781 A1 * | 10/2008 | Han et al. | 257/13 |
| 2009/0045416 A1 * | 2/2009 | Bierhuizen et al. | 257/88 |
| 2009/0085048 A1 * | 4/2009 | Lee et al. | 257/89 |
| 2009/0173957 A1 | 7/2009 | Brunner et al. | |
| 2010/0032644 A1 * | 2/2010 | Akita et al. | 257/13 |
| 2010/0096615 A1 | 4/2010 | Okamoto et al. | |
| 2010/0108985 A1 * | 5/2010 | Chung et al. | 257/13 |
| 2010/0109025 A1 * | 5/2010 | Bhat | 257/88 |
| 2010/0132770 A1 | 6/2010 | Beatty et al. | |
| 2010/0244063 A1 * | 9/2010 | Yokogawa et al. | 257/94 |
| 2010/0275837 A1 * | 11/2010 | Hashimoto et al. | 117/101 |
| 2010/0308357 A1 * | 12/2010 | Horie et al. | 257/98 |
| 2011/0031522 A1 | 2/2011 | Oya et al. | |
| 2011/0140125 A1 * | 6/2011 | Lin et al. | 257/76 |
| 2011/0253977 A1 * | 10/2011 | Oya et al. | 257/13 |

FOREIGN PATENT DOCUMENTS

| | | | |
|---|---|---|---|
| JP | 07-011430 A * | 1/1995 | |
| JP | 08-064871 | 3/1996 | |
| JP | 08-064871 A * | 3/1996 | |
| JP | 10-084159 | 3/1998 | |
| JP | 10-084159 A * | 3/1998 | |
| JP | 10-341039 | 12/1998 | |
| JP | 11-016852 A | 1/1999 | |
| JP | 11-040846 | 2/1999 | |
| JP | 11-233890 | 8/1999 | |
| JP | 11-274554 | 10/1999 | |
| JP | 2000-174333 | 6/2000 | |
| JP | 2000-174333 A * | 6/2000 | |
| JP | 2001-148534 | 5/2001 | |
| JP | 2001-160656 A | 6/2001 | |
| JP | 2001-308462 | 11/2001 | |
| JP | 2003-332697 | 11/2003 | |
| JP | 2005-260172 | 9/2005 | |
| JP | 2008-109066 | 5/2008 | |
| JP | 2008-153285 A | 7/2008 | |
| JP | 2008-235804 | 10/2008 | |
| JP | 2008-235804 A * | 10/2008 | |
| JP | 2008-277539 | 11/2008 | |
| JP | 2009-043613 | 2/2009 | |
| JP | 4486701 | 6/2010 | |
| WO | 2008-073385 A1 | 6/2008 | |
| WO | 2010/103804 A1 | 9/2010 | |
| WO | 2010/116703 A1 | 10/2010 | |

OTHER PUBLICATIONS

Hautakangas et al, "Vacancy Defects as Compensating Centers in Mg-Doped GaN", Physical Review Letters, vol. 90, No. 13, 137402 (1-4).*

Co-pending U.S. Appl. No. 12/679,347, filed Mar. 22, 2010 (current claims and application provided).

International Search Report for corresponding application No. PCT/JP2010/007400 mailed Apr. 5, 2011.

Form PCT/ISA/237 for corresponding International Application No. PCT/JP2010/007400 dated Apr. 5, 2011.

Notice of Reasons for Rejection for Japanese Application No. 2011-520266 issued Jun. 28, 2011 (which is a national phase application of PCT/JP2010/007400 and a full English translation).

International Search Report for related application No. PCT/JP2009/002532 mailed Jul. 7, 2009.

Form PCT/ISA/237 for related application No. PCT/JP2009/002532 dated Jul. 7, 2009.and a partial English translation.

Yuhzoh Tsuda et al., "Blue Laser Diodes Fabricated on $m$-Plane GaN Substrates", Applied Physics Express 1 (2008) 011104, pp. 1-3.

Kuniyoshi Okamoto et al., "Nonpolar $m$-plane InGaN multiple quantum well laser diodes with a lasing wavelength of 499.8 nm", Applied Physics Letters 94 (2009) 071105, pp. 1-3.

Rika Tamai et al., "Development of an apparatus for deposition coating with a high purity magnesium and evaluation on adhesion and corrosion resistance of the coated AZ31B magnesium alloys", Journal of Japan Institute of Light Metals, vol. 56, No. 10 (2006) pp. 538-542.

Kenji Iso et al, "High Brightness Blue InGaN/GaN Light Emitting Diode on Nonpolar $m$-plane Bulk GaN Substrate", Japanese Journal of Applied Physics, vol. 46, No. 40 (2007), pp. L960-L962.

Kwang-Choong Kim et al., "Study of nonpolar $m$-plane InGaN/GaN multiquantum well light emitting diodes grown by homoepitaxial metal-organic chemical vapor deposition", Applied Physics Letters, 91 (2007) 181120 pp. 1-3.

Co-pending U.S. Appl. No. 13/125,367, filed Apr. 21, 2011, (corresponds to WO 2010/116703 A1).

Supplementary European Search Report for corresponding European Application No. 09815447.9 dated Mar. 30, 2012.

Office Action for co-pending U.S. Appl. No. 12/679,347 mailed on Mar. 16, 2012.

Office Action for co-pending U.S. Appl. No. 12/679,347 mailed on Sep. 10, 2012.

Extended European Search Report for corresponding European Application No. EP 10 83 8943 dated Sep. 21, 2012.

Mochida et al., "Crystal Orientation Dependence of P-Type Contact Resistance of GaN", Journal of Crystal Growth, Elsevier, Amsterdam, NL, vol. 189-190, Jun. 15, 1998, pp. 716-719, XP004148608.

Office Action for co-pending U.S. Appl. No. 12/679,347 mailed on Apr. 3, 2013.

Office Action for co-pending U.S. Appl. No. 13/708,097 mailed on Apr. 15, 2013.

* cited by examiner (a)

| | as-depo | 500°C | 600°C | 700°C |
|---|---|---|---|---|
| M-GaN (Mg/Pt) | | | | |
| M-GaN (Pd/Pt) | | | | |
| C-GaN (Pd/Pt) | | | | |

(a)

(b)

(a)

(b)

(a)

(b)

(a)

(b)

(c)

(a)

(b)

NITRIDE-BASED SEMICONDUCTOR DEVICE AND METHOD FOR FABRICATING THE SAME

This is a continuation of International Application No. PCT/JP2010/007400, with an international filing date of Dec. 21, 2010, which claims priority of Japanese Patent Application No. 2009-294617, filed on Dec. 25, 2009, the contents of which are hereby incorporated by reference.

TECHNICAL FIELD

The present disclosure relates to a nitride-based semiconductor device and a method for fabricating such a device. The present disclosure also relates to a method of making an electrode for use in such a nitride-based semiconductor device.

BACKGROUND

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $0 \leq x, y, z \leq 1$ and $x+y+z=1$)) have been researched and developed particularly extensively. As a result, blue-ray-emitting light-emitting diodes (LEDs), green-ray-emitting LEDs and semiconductor laser diodes made of GaN-based semiconductors have already been used in actual products (see Japanese Patent Application Laid-Open Publications Nos. 2001-308462 and 2003-332697, for example).

A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c axis". A plane that intersects with the c axis at right angles is called either a "c plane" or a "(0001) plane". It should be noted that the "c axis" and the "c plane" are sometimes referred to as "C axis" and "C plane". Thus, in the accompanying drawings, those axes and planes are identified by the capital letter to make them recognizable more easily.

In fabricating a semiconductor device using GaN-based semiconductors, a c-plane substrate, i.e., a substrate of which the principal surface is a (0001) plane, is used as a substrate on which GaN semiconductor crystals will be grown. In a c plane, however, there is a slight shift in the c-axis direction between a Ga atom layer and a nitrogen atom layer, thus producing electrical polarization there. That is why the c plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer due to the quantum confinement Stark effect of carriers. Consequently, the internal quantum efficiency decreases, thus increasing the threshold current in a semiconductor laser diode and increasing the power dissipation and decreasing the luminous efficacy in an LED. Meanwhile, as the density of injected carriers increases, the piezoelectric field is screened, thus varying the emission wavelength, too.

Thus, to overcome these problems, it has been proposed that a substrate, of which the principal surface is a non-polar plane such as a (10-10) plane that is perpendicular to the [10-10] direction and that is called an "m plane", be used. In this description, "−" attached on the left-hand side of a Miller-Bravais index in the parentheses means a "bar" (a negative direction index). As shown in FIG. 2, the m plane is parallel to the c axis (i.e., the primitive vector c) and intersects with the c plane at right angles. On the m plane, Ga atoms and nitrogen atoms are on the same atomic plane. For that reason, no electrical polarization will be produced perpendicularly to the m plane. That is why if a semiconductor multilayer structure is formed perpendicularly to the m plane, no piezoelectric field will be generated in the active layer, thus overcoming the problems described above.

In this case, the "m plane" is a generic term that collectively refers to a family of planes including (10-10), (−1010), (1-100), (−1100), (01-10) and (0-110) planes. Also, in this description, the "X-plane growth" means epitaxial growth that is produced perpendicularly to the X plane (where X=c or m) of a hexagonal wurtzite structure. As for the X-plane growth, the X plane will be sometimes referred to herein as a "growing plane". Furthermore, a layer of semiconductor crystals that have been formed as a result of the X-plane growth will be sometimes referred to herein as an "X-plane semiconductor layer".

SUMMARY

As described above, a GaN-based semiconductor device that has been grown on an m-plane substrate would achieve far more beneficial effects than what has been grown on a c-plane substrate but still has the following drawback. Specifically, a GaN-based semiconductor device that has been grown on an m-plane substrate has higher contact resistance than what has been grown on a c-plane substrate, which constitutes a serious technical obstacle to using such a GaN-based semiconductor device that has been grown on an m-plane substrate.

Under the circumstances such as these, the present inventors carried out extensive research to overcome such a problem with the prior art that a GaN-based semiconductor device, grown on an m plane as a non-polar plane, would have high contact resistance. As a result, we found an effective means for reducing the contact resistance.

One non-limiting and exemplary embodiment provides a structure and manufacturing process that will be able to reduce the contact resistance of a GaN-based semiconductor device that has been fabricated by producing a crystal growth on an m-plane substrate.

In one general aspect, the techniques disclosed here feature a nitride-based semiconductor device of an embodiment including: a nitride-based semiconductor multilayer structure including a p-type semiconductor region; and an electrode that is arranged on the p-type semiconductor region. The p-type semiconductor region is made of an $Al_xIn_yGa_zN$ (where $x+y+z=1$, $x \geq 0$, $y \geq 0$ and $z \geq 0$) semiconductor. The p-type semiconductor region is a semiconductor layer that defines a tilt angle of one degree or more with respect to an m plane. An angle of 1 to 5 degrees is formed between a normal to the principal surface of the p-type semiconductor region and a normal to the m plane. The electrode includes an Mg layer, which is in contact with the principal surface of the p-type semiconductor region, and a metal layer, which has been formed on the Mg layer. The metal layer is formed from at least one metallic element that is selected from the group consisting of Pt, Mo and Pd.

These general and specific aspects may be implemented using a system, a method, and a computer program, and any combination of systems, methods, and computer programs.

In a nitride-based semiconductor device according to the present disclosure, an electrode on a semiconductor multilayer structure includes an Mg layer that contacts with the principal surface (which is an m plane) of a p-type semiconductor region. As a result, the contact resistance can be reduced. In addition, according to the present disclosure, even if the p-type semiconductor region used has a principal surface that defines a tilt angle of 1 to 5 degrees with respect to an m plane, the same effect will be achieved as in a situation where the principal surface of the p-type semiconductor region defines a tilt angle of less than one degree with respect to an m plane.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF DRAWINGS

FIG. 9 shows optical microscope photographs representing the surface states of an electrode that was thermally treated at respective temperatures as a substitute for a drawing.

DETAILED DESCRIPTION

Figure 1:
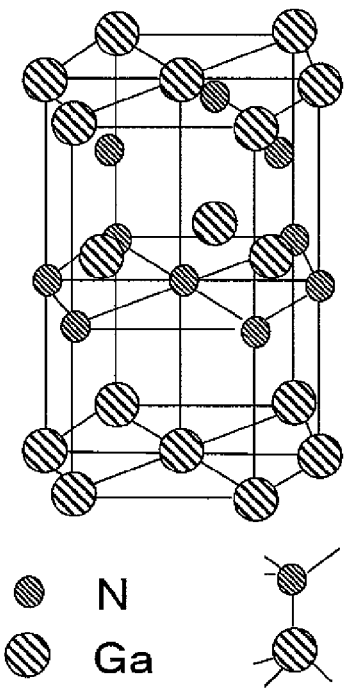
FIG. 1 is a perspective view schematically illustrating a unit cell of GaN.

A nitride-based semiconductor device of the present disclosure includes: a nitride-based semiconductor multilayer structure including a p-type semiconductor region; and an electrode that is arranged on the p-type semiconductor region. The p-type semiconductor region is made of an $Al_xIn_yGa_zN$ (where $x+y+z=1$, $x \geq 0$, $y \geq 0$ and $z \geq 0$) semiconductor. The p-type semiconductor region is a semiconductor layer that defines a tilt angle of one degree or more with respect to an m plane. An angle of 1 to 5 degrees is formed between a normal to the principal surface of the p-type semiconductor region and a normal to the m plane. The electrode includes an Mg layer, which is in contact with the principal surface of the p-type semiconductor region, and a metal layer formed on the Mg layer. The metal layer is formed from at least one metallic element that is selected from the group consisting of Pt, Mo and Pd.

In the nitride-based semiconductor device of the present disclosure, the contact resistance can be reduced.

In an embodiment, an alloy layer, including Mg and the at least one metallic element selected from the group consisting of Pt, Mo and Pd, is sandwiched between the Mg layer and the metal layer.

In an embodiment, the Mg layer is made up of a film that is present on the principal surface of the p-type semiconductor region.

In an embodiment, the Mg layer is made up of islands of Mg portions that are distributed over the principal surface of the p-type semiconductor region.

In an embodiment, the nitride-based semiconductor multilayer structure has an active layer including an $Al_aIn_bGa_cN$ layer (where $a+b+c=1$, $a≥0$, $b≥0$ and $c≥0$) and emitting light.

In an embodiment, the Mg layer has a thickness of 2 nm to 45 nm.

In an embodiment, the Mg layer has a thickness of 2 nm to 15 nm.

In an embodiment, the thickness of the Mg layer is equal to or smaller than that of the metal layer.

In an embodiment, the concentration of Ga in the Mg layer is higher than that of nitrogen in the same Mg layer.

In an embodiment, the concentration of Ga is ten times or more as high as that of nitrogen.

In an embodiment, the semiconductor device further includes a semiconductor substrate that supports the nitride-based semiconductor multilayer structure.

A light source of the present disclosure includes: a nitride-based semiconductor light-emitting device; and a wavelength conversion portion including a phosphor that changes the wavelength of the light emitted from the nitride-based semiconductor light-emitting device. The nitride-based semiconductor light-emitting device includes: a nitride-based semiconductor multilayer structure including a p-type semiconductor region; and an electrode that is arranged on the p-type semiconductor region. The p-type semiconductor region is made of an $Al_xIn_yGa_zN$ (where $x+y+z=1$, $x≥0$, $y≥0$ and $z≥0$) semiconductor, and is a semiconductor layer that defines a tilt angle of one degree or more with respect to an m plane. An angle of 1 to 5 degrees is formed between a normal to the principal surface of the p-type semiconductor region and a normal to the m plane. The electrode includes an Mg layer, which is in contact with the principal surface of the p-type semiconductor region, and a metal layer formed on the Mg layer. The metal layer is formed from at least one metallic element that is selected from the group consisting of Pt, Mo and Pd.

A method for fabricating a nitride-based semiconductor device according to the present disclosure includes the steps of: (a) providing a substrate; (b) forming a nitride-based semiconductor multilayer structure, including a p-type semiconductor region, on the substrate, the p-type semiconductor region being made of an $Al_xIn_yGa_zN$ (where $x+y+z=1$, $x≥0$, $y≥0$ and $z≥0$) semiconductor, an angle of 1 to 5 degrees being formed between a normal to the principal surface of the semiconductor and a normal to an m plane; and (c) forming an electrode on the principal surface of the p-type semiconductor region of the nitride-based semiconductor multilayer structure. The step (c) includes forming an Mg layer on the principal surface of the p-type semiconductor region and forming a metal layer, which is formed from at least one metallic element selected from the group consisting of Pt, Mo and Pd, after the Mg layer has been formed.

In an embodiment, the step (c) includes the step of subjecting the Mg layer to a heat treatment after the metal layer has been formed.

In an embodiment, the heat treatment is carried out at a temperature of 500° C. to 700° C.

In an embodiment, the heat treatment is carried out at a temperature of 550° C. to 650° C.

In an embodiment, the step of forming the Mg layer includes depositing Mg by evaporation onto the principal surface of the p-type semiconductor region by irradiating Mg with pulses of an electron beam.

In an embodiment, the method includes the step of setting the thickness of the Mg layer to be within the range of 2 nm to 45 nm after the heat treatment.

In an embodiment, the step (b) includes the step of forming a layer of an $Al_xIn_yGa_zN$ (where $x+y+z=1$, $x≥0$, $y≥0$ and $z≥0$) semiconductor.

In an embodiment, the method includes the step of removing the substrate after the step (b) has been performed.

In an embodiment, the concentration of Ga in the Mg layer is higher than that of nitrogen in the same Mg layer.

In an embodiment, the concentration of Ga is ten times or more as high as that of nitrogen.

A method of making an electrode for a semiconductor device according to the present disclosure includes the steps of: forming an Mg thin film on a p-type semiconductor region by irradiating Mg with pulses of an electron beam and evaporating Mg; and forming a metal layer, which is formed from at least one metallic element selected from the group consisting of Pt, Mo and Pd, on the Mg thin film that has been formed. The p-type semiconductor region is a semiconductor layer that defines a tilt angle of one degree or more with respect to an m plane. An angle of 1 to 5 degrees is formed between a normal to the principal surface of the p-type semiconductor region and a normal to an m plane.

In an embodiment, the Mg thin film is formed without heating a supporting member on which the Mg thin film is going to be formed.

Another nitride-based semiconductor device according to the present disclosure includes: a nitride-based semiconductor multilayer structure including a p-type semiconductor region that is made of a GaN-based semiconductor; and an electrode that is arranged on the p-type semiconductor region. The p-type semiconductor region is made of an $Al_xIn_yGa_zN$ (where $x+y+z=1$, $x≥0$, $y≥0$ and $z≥0$) semiconductor, and is a semiconductor layer that defines a tilt angle of one degree or more with respect to an m plane. An angle of 1 to 5 degrees is formed between a normal to the principal surface of the p-type semiconductor region and a normal to the m plane. The electrode includes an Mg layer and an alloy layer formed on the Mg layer. The alloy layer includes Mg and at least one metallic element selected from the group consisting of Pt, Mo and Pd.

Still another nitride-based semiconductor device according to the present disclosure includes: a nitride-based semiconductor multilayer structure including a p-type semiconductor region that is made of a GaN-based semiconductor; and an electrode that is arranged on the p-type semiconductor region. The p-type semiconductor region is made of an $Al_xIn_yGa_zN$ (where $x+y+z=1$, $x≥0$, $y≥0$ and $z≥0$) semiconductor, and is a semiconductor layer that defines a tilt angle of one degree or more with respect to an m plane. An angle of 1 to 5 degrees is formed between a normal to the principal surface of the p-type semiconductor region and normal to the m plane. The electrode includes an Mg layer, which is in contact with the principal surface of the p-type semiconductor region, and a metal layer formed on the Mg layer. The metal layer is formed from a metallic element that makes an alloy with Mg less easily than Au does.

In an embodiment, the p-type semiconductor region is made of a GaN-based semiconductor.

In an embodiment, the p-type semiconductor region is made of GaN.

Another light source according to the present disclosure includes: a nitride-based semiconductor light-emitting device, and a wavelength conversion portion including a phosphor that changes the wavelength of the light emitted from the nitride-based semiconductor light-emitting device. The nitride-based semiconductor light-emitting device includes: a nitride-based semiconductor multilayer structure including a p-type semiconductor region that is made of a GaN-based semiconductor; and an electrode that is arranged on the p-type semiconductor region. The p-type semiconductor region is made of an $Al_xIn_yGa_zN$ (where x+y+z=1, x≥0, y≥0 and z≥0) semiconductor, and is a semiconductor layer that defines a tilt angle of one degree or more with respect to an m plane. An angle of 1 to 5 degrees is formed between a normal to the principal surface of the p-type semiconductor region and a normal to the m plane. The electrode includes an Mg layer, which is in contact with the principal surface of the p-type semiconductor region, and a metal layer formed on the Mg layer. The metal layer is formed from a metallic element that makes an alloy with Mg less easily than Au does.

In an embodiment, the p-type semiconductor region is made of a GaN-based semiconductor.

In an embodiment, the p-type semiconductor region is made of GaN.

Another method for fabricating a nitride-based semiconductor device according to the present disclosure includes the steps of: (a) providing a substrate; (b) forming a nitride-based semiconductor multilayer structure, including a p-type semiconductor region that is made of a GaN-based semiconductor, on the substrate, the p-type semiconductor region being made of an $Al_xIn_yGa_zN$ (where x+y+z=1, x≥0, y≥0 and z≥0) semiconductor, an angle of 1 to 5 degrees being formed between a normal to the principal surface of the semiconductor and a normal to an m plane; and (c) forming an electrode on the principal surface of the p-type semiconductor region of the nitride-based semiconductor multilayer structure. The step (c) includes forming an Mg layer on the principal surface of the p-type semiconductor region and forming a metal layer, which is formed from a metallic element that makes an alloy with Mg less easily than Au does, after the Mg layer has been formed.

In an embodiment, the p-type semiconductor region is made of a GaN-based semiconductor.

In an embodiment, the p-type semiconductor region is made of GaN.

Hereinafter, exemplary embodiments of the present disclosure will be described with reference to the accompanying drawings. In the drawings, any pair of components shown in multiple drawings and having substantially the same function will be identified by the same reference numeral for the sake of simplicity. It should be noted, however, that the present invention is in no way limited to the specific exemplary embodiments to be described below.

Figure 3:
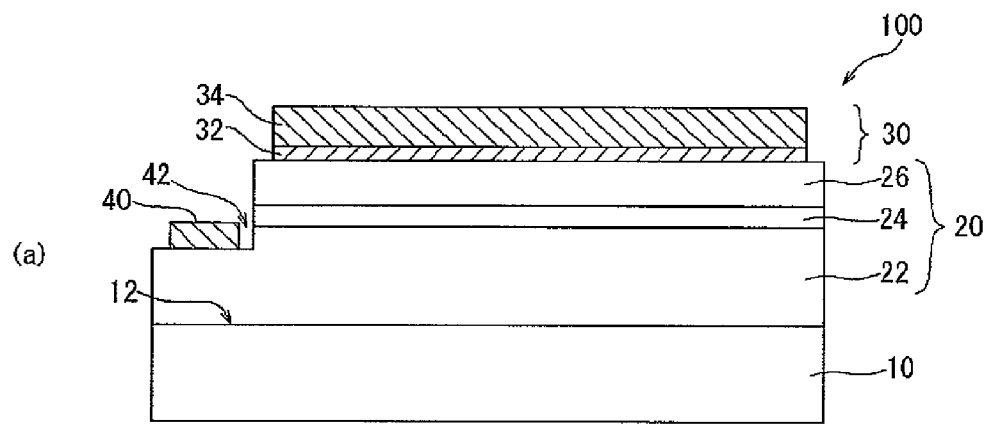
FIG. 3(a) is a schematic cross-sectional view illustrating a nitride-based semiconductor light-emitting device 100 as an embodiment of the present disclosure.
FIGS. 3(b) and 3(c) illustrate the crystal structures of an m plane and a c plane, respectively.
Figure 3:
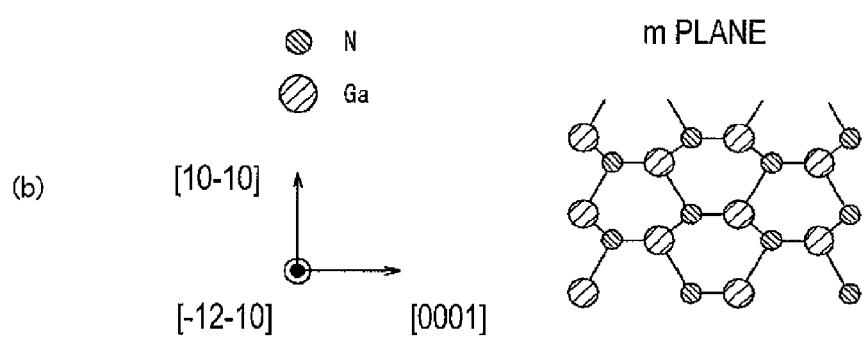
Figure 3:
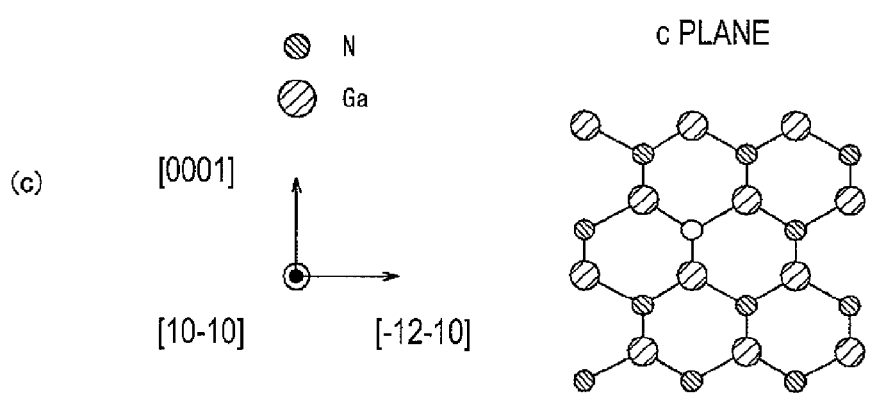
Figure 4:
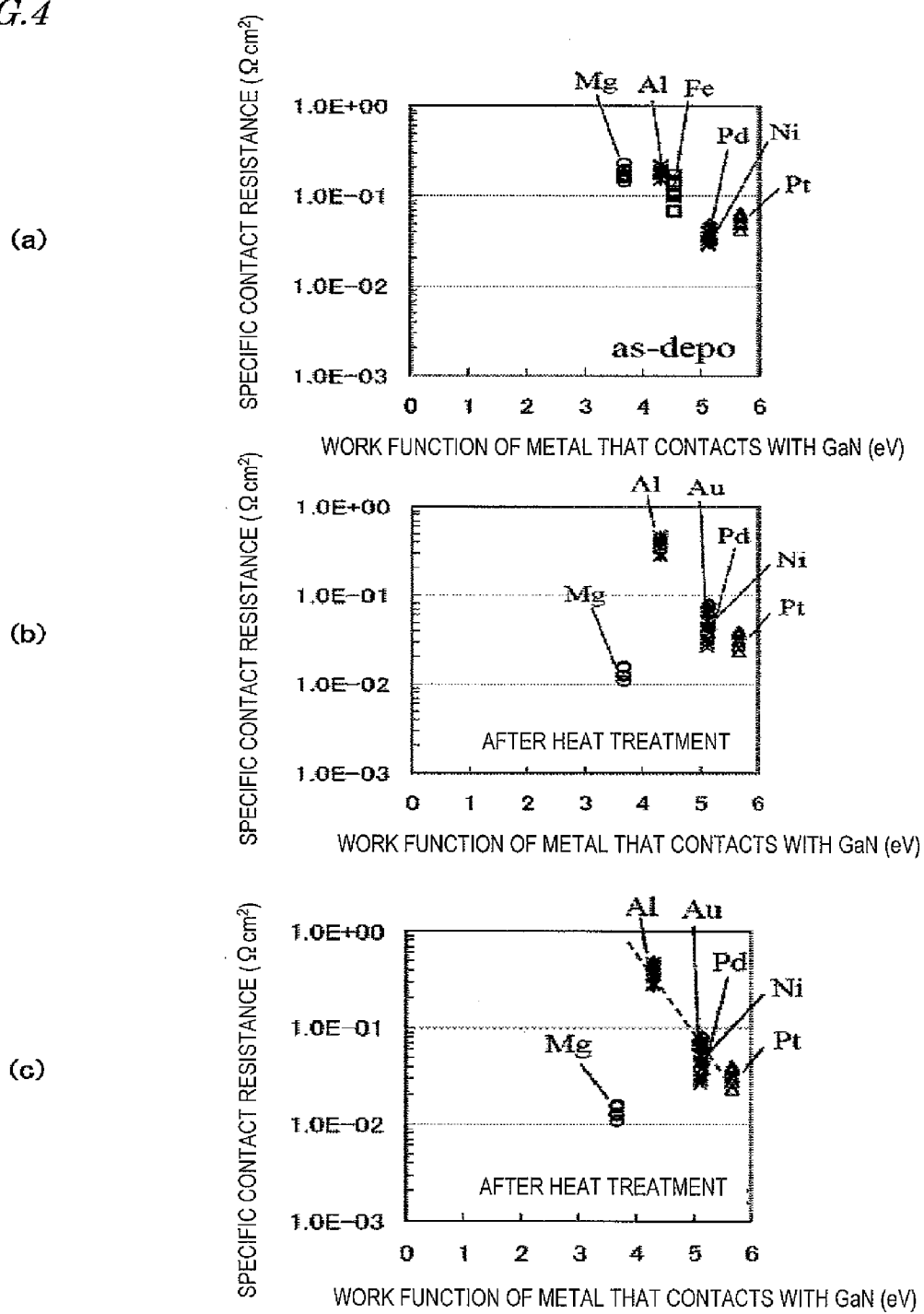
FIGS. 4(a) through 4(c) are graphs showing how the specific contact resistance ($\Omega \cdot cm^2$) changed with the work function (eV) of a metal that was in contact with GaN.
Figure 5:
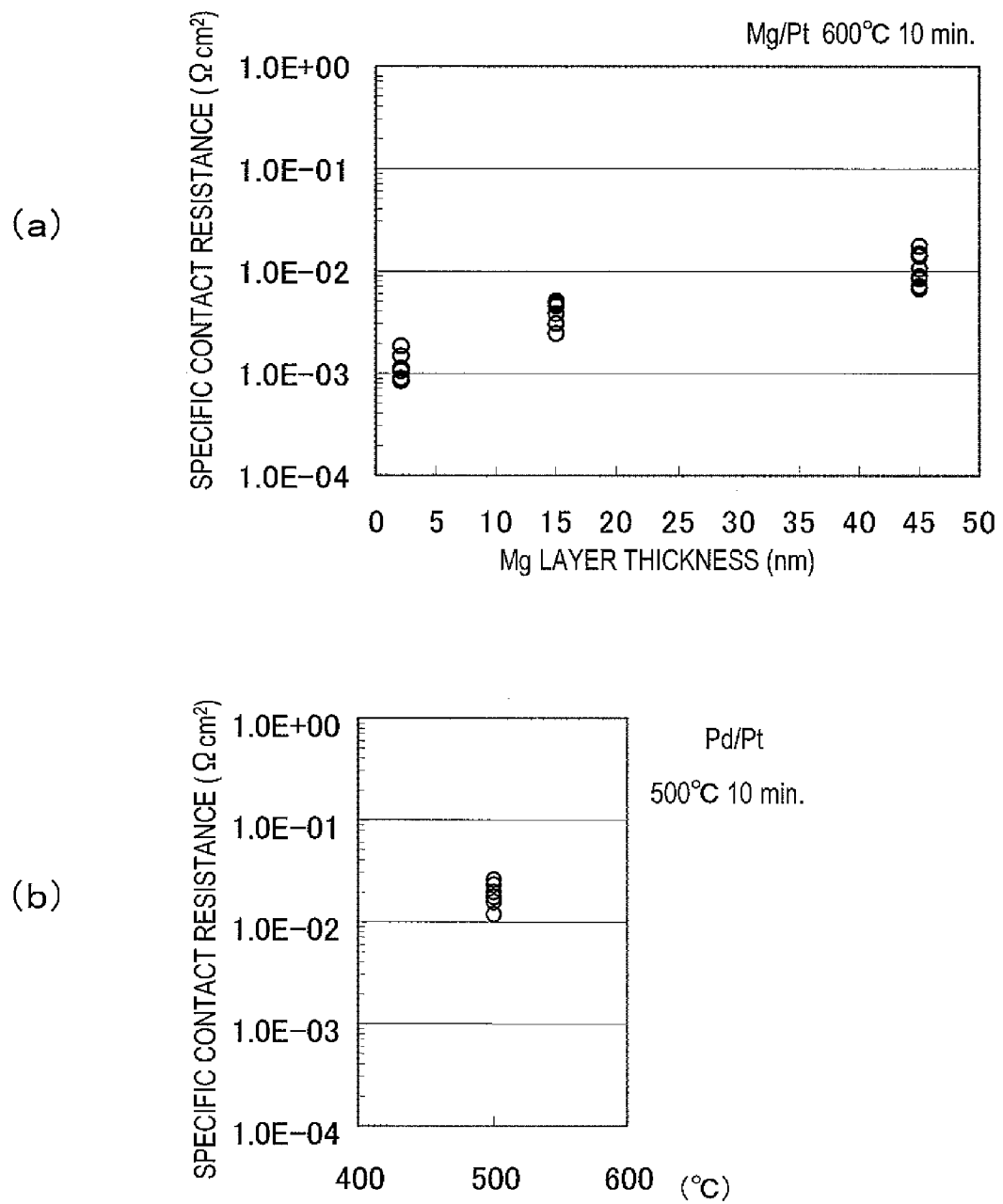
FIG. 5(a) is a graph showing how the specific contact resistance changed with the thickness of a thermally treated Mg layer in an Mg/Pt electrode and FIG. 5(b) is a graph showing the specific contact resistance of a Pd/Pt electrode.
Figure 6:
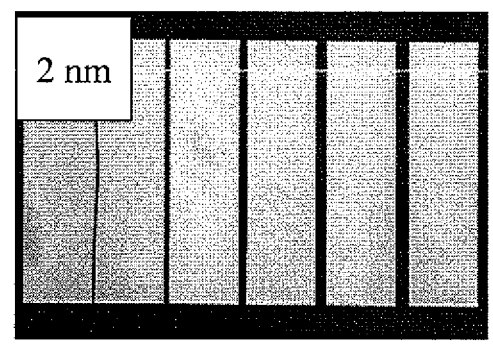
FIGS. 6(a) through 6(c) are photographs showing the surface states of a thermally treated electrode in situations where the Mg layer had thicknesses of 2 nm, 15 nm and 45 nm, respectively.
Figure 6:
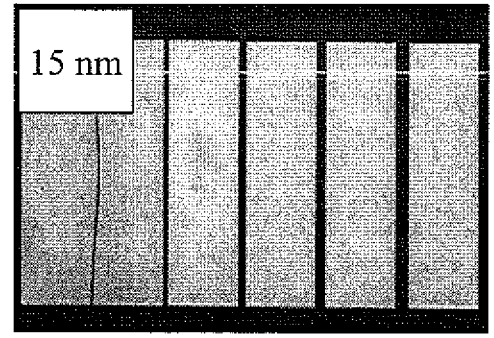
Figure 6:
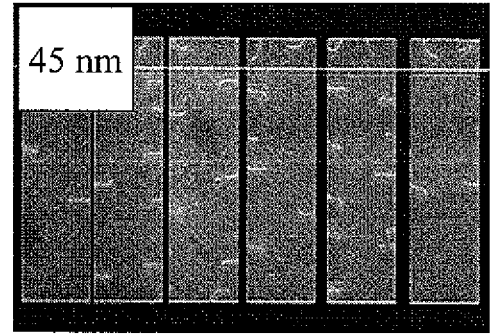

FIG. 3(a) schematically illustrates the cross-sectional structure of a nitride-based semiconductor light-emitting device 100 as an embodiment of the present disclosure. The nitride-based semiconductor light-emitting device 100 illustrated in FIG. 3(a) is a semiconductor device made of GaN based semiconductors and has a nitride-based semiconductor multilayer structure.

The nitride-based semiconductor light-emitting device 100 of this embodiment includes a GaN-based substrate 10, of which the principal surface 12 is an m plane, a semiconductor multilayer structure 20 that has been formed on the GaN-based substrate 10, and an electrode 30 arranged on the semiconductor multilayer structure 20. In this embodiment, the semiconductor multilayer structure 20 is an m-plane semiconductor multilayer structure that has been formed through an m-plane crystal growth and its principal surface is an m plane. It should be noted, however, that a-plane GaN could grow on an r-plane sapphire substrate in some instances. That is why according to the growth conditions, the principal surface of the GaN-based substrate 10 does not always have to be an m plane. In the semiconductor multilayer structure 20 of the present disclosure, at least the surface of its p-type semiconductor region that contacts with an electrode needs to be an m plane.

The nitride-based semiconductor light-emitting device 100 of this embodiment includes the GaN-based substrate to support the semiconductor multilayer structure 20. However, the device 100 may have any other substrate instead of the GaN-based substrate 10 and could also be used without the substrate.

FIG. 3(b) schematically illustrates the crystal structure of a nitride-based semiconductor, of which the principal surface is an m plane, as viewed on a cross section thereof that intersects with the principal surface of the substrate at right angles. Since Ga atoms and nitrogen atoms are present on the same atomic plane that is parallel to the m plane, no electrical polarization will be produced perpendicularly to the m plane. That is to say, the m plane is a non-polar plane and no piezo-electric field will be produced in an active layer that grows perpendicularly to the m plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m plane.

Such a GaN-based substrate, of which the principal surface is an m plane, will be referred to herein as an "m-plane GaN-based substrate". To obtain an m-plane nitride-based semiconductor multilayer structure that has grown perpendicularly to the m plane, typically such an m-plane GaN-based substrate may be used and semiconductors may be grown on the m plane of that substrate. This is because the crystallographic plane orientation of the semiconductor multilayer structure should be identical with that of the principal surface of the GaN-based substrate. However, the principal surface of the substrate does not always have to be an m plane as described above, and the device as a final product could already have had its substrate removed.

The crystal structure of a nitride-based semiconductor, of which the principal surface is a c plane, as viewed on a cross section thereof that intersects with the principal surface of the substrate at right angles is illustrated schematically in FIG. 3(c) just for your reference. In this case, Ga atoms and nitrogen atoms are not present on the same atomic plane that is parallel to the c plane, and therefore, electrical polarization will be produced perpendicularly to the c plane. Such a GaN-based substrate, of which the principal surface is a c plane, will be referred to herein as a "c-plane GaN-based substrate".

A c-plane GaN-based substrate is generally used to grow GaN-based semiconductor crystals thereon. In such a substrate, a Ga atom layer and a nitrogen atom layer that extend parallel to the c plane are slightly misaligned from each other in the c-axis direction, and therefore, electrical polarization will be produced in the c-axis direction.

Now look at FIG. 3(a) again. On the principal surface (that is an m plane) 12 of the m-plane GaN-based substrate 10, the semiconductor multilayer structure 20 has been formed. The semiconductor multilayer structure 20 includes an active layer 24 including an $Al_aIn_bGa_cN$ layer (where a+b+c=1, a≥0, b≥0 and c≥0), and an $Al_dGa_eN$ layer (where d+e=1, d≥0 and e≥0) 26, which is located on the other side of the active layer 24 opposite to the m plane 12. In this case, the active layer 24 is an electron injection region of the nitride-based semiconductor light-emitting device 100.

The semiconductor multilayer structure 20 of this embodiment has other layers, one of which is an $Al_uGa_vIn_wN$ layer (where u+v+w=1, u≥0, v≥0 and w≥0) 22 that is arranged between the active layer 24 and the substrate 10. The $Al_uGa_vIn_wN$ layer 22 of this embodiment has first conductivity type, which may be n-type, for example. Optionally, an undoped GaN layer could be inserted between the active layer 24 and the $Al_dGa_eN$ layer 26.

In the $Al_dGa_eN$ layer 26, the mole fraction d of Al does not have to be uniform, but could vary either continuously or stepwise, in the thickness direction. In other words, the $Al_dGa_eN$ layer 26 could have a multilayer structure in which a number of layers with mutually different Al mole fractions d are stacked one upon the other, or could have its dopant concentration varied in the thickness direction. To reduce the contact resistance, the uppermost portion of the $Al_dGa_eN$ layer 26 (i.e., the upper surface region of the semiconductor multilayer structure 20) may be a layer that has an Al mole fraction d of zero (i.e., a GaN layer), for example. In that case, the Mg layer 32 to be described later will be in contact with the GaN layer. However, the Al mole fraction d does not have to be zero. Alternatively, an $Al_{0.05}Ga_{0.95}N$ layer, of which the Al mole fraction d is approximately 0.05, could also be used. Then, the Mg layer 32 to be described later will be in contact with that $Al_{0.05}Ga_{0.95}N$ layer.

An electrode 30 has been formed on the semiconductor multilayer structure 20. The electrode 30 of this embodiment includes an Mg layer 32 consisting essentially of Mg, on which stacked is a Pt layer consisting essentially of Pt. In the electrode 30, the Mg layer 32 is in contact with the p-type semiconductor region of the semiconductor multilayer structure 20 and functions as a portion of a p- (or p-side) electrode. In this embodiment, the Mg layer 32 is in contact with the $Al_dGa_eN$ layer 26 that is doped with a dopant of a second conductivity type (e.g., p-type), which may be Mg. Examples of other p-type dopants may include Zn and Be.

The metal layer 34 that contacts with the surface of the Mg layer 32 does not have to be a Pt layer but may also be a layer of a metal that would make an alloy with Mg less easily than Au does. Stated otherwise, the metal layer 34 to contact with the Mg layer 32 should not be made of Au (gold) that would make an alloy with Mg easily. The Mg layer 32 does not make an alloy with Pt or any other suitable metal that constitutes the metal layer 34. It should be noted, however, that "does not make an alloy with Pt or any other suitable metal" could also refer to a situation where Mg includes a metal such as Pt at a concentration of less than a few percent (which may be less than one percent). In other words, "make an alloy with a metal such as Pt" refers to a situation where Mg includes a metal such as Pt at a concentration of at least a few percent (which may be equal to or greater than one percent). The Mg layer 32 and the metal layer 34 could also contain some impurities to be inevitably included during the process steps of forming those layers.

Optionally, there could be an alloy layer containing Mg between the Mg layer 32 and the metal layer 34. Pt, Mo and Pd are metals that would make an alloy with Mg less easily than Au does. But an alloy layer could still be produced through a reaction to a portion of the Mg layer 32 as a result of the heat treatment to be described later.

If a relatively thin metal layer has been deposited on the Mg layer 32, then all of that thin metal layer could make an alloy with some of Mg atoms in the Mg layer. In that case, there would be only that alloy layer on the Mg layer.

In any case, on the electrode with any of various combinations of metals described above, not just the metal layer 34 or the alloy layer but also an electrode layer or an interconnect layer made of a different metal or alloy could be stacked.

In this embodiment, the electrode 30 may have a thickness of 10 nm to 200 nm, for example. In the electrode 30, the Mg layer 32 may have a thickness of 2 nm to 45 nm. It should be noted that in this case, the thickness of the Mg layer 32 is supposed to be that of the Mg layer that has already been thermally treated.

On the other hand, the metal layer 34, which is made of at least one metal selected from the group consisting of Pt, Mo and Pd and which has been stacked on the Mg layer 32, may have a thickness of 200 nm or less (or fall within the range of 10 nm to 200 nm), for example. It should be noted that the Mg layer 32 may be thinner than the metal layer 34. This is because if the strain balance were lost between the Mg layer 32 and the metal layer 34, the Mg layer 32 could peel off from the $Al_dGa_eN$ layer 26.

Meanwhile, the GaN-based substrate 10, of which the principal surface 12 is an m plane, may have a thickness of 100 μm to 400 μm, for example. This is because if the wafer has a thickness of at least approximately 100 μm, then there will be no trouble handling such a wafer. It should be noted that as long as the substrate 10 of this embodiment has an m-plane principal surface 12 made of a GaN-based material, the substrate 10 could have a multilayer structure. That is to say, the GaN-based substrate 10 of this embodiment could also refer to a substrate, at least the principal surface 12 of which is an m plane. That is why the entire substrate could be made of a GaN-based material. Or the substrate may also be made of the GaN-based material and another material in any combination.

In the structure of this embodiment, an electrode 40 has been formed as an n-side electrode on a portion of an n-type $Al_uGa_vIn_wN$ layer 22 (with a thickness of 0.2 μm to 2 μm, for example) on the substrate 10. In the example illustrated in FIG. 3(a), in the region of the semiconductor multilayer structure 20 where the electrode 40 is arranged, a recess 42 has been cut so as to expose a portion of the n-type $Al_uGa_vIn_wN$ layer 22. And the electrode 40 has been formed on the exposed surface of the n-type $Al_uGa_vIn_wN$ layer 22 at the bottom of the recess 42. The electrode 40 may have a multilayer structure consisting of Ti, Al and Pt layers and may have a thickness of 100 nm to 200 nm, for example.

In this embodiment, the active layer 24 has a GaInN/GaN multi-quantum well (MQW) structure (with a thickness of 81 nm, for example) in which $Ga_{0.9}In_{0.1}N$ well layers (each having a thickness of 9 nm, for example) and GaN barrier layers (each having a thickness of 9 nm, for example) are alternately stacked one upon the other.

On the active layer 24, stacked is the p-type $Al_dGa_eN$ layer 26, which may have a thickness of 0.2 μm to 2 μm. Optionally, an undoped GaN layer could be inserted between the active layer 24 and the $Al_dGa_eN$ layer 26 as described above.

In addition, a GaN layer of the second conductivity type (which may be p-type, for example) could be formed on the $Al_dGa_eN$ layer 26. Furthermore, a contact layer of $p^+$-GaN and the Mg layer 32 could be stacked in this order on that GaN layer. In that case, the GaN contact layer could also be regarded as forming part of the $Al_dGa_eN$ layer 26, not a layer that has been stacked separately from the $Al_dGa_eN$ layer 26.

Hereinafter, the features of this embodiment will be described in further detail with reference to FIGS. 4 through 15.

First of all, FIGS. 4(a) and 4(b) are graphs showing how the specific contact resistance ($\Omega \cdot cm^2$) changes with the work function of the metal that contacts with m-plane GaN. More specifically, the results shown in FIGS. 4(a) and 4(b) were obtained by forming various metal layers (consisting of an Mg layer with a thickness of 2 nm and the other metal layers with a thickness of 200 nm) on an Mg-doped p-type GaN layer (with an Mg concentration of approximately $1 \times 10^{19}$ $cm^{-3}$) and then estimating their contact resistances by TLM (transmission line method). It should be noted that the ordinates "1.0E-01" and "1.0E-02" mean "$1.0 \times 10^{-1}$" and "$1.0 \times 10^{-2}$", respectively. That is to say, "1.0E+X" means "$1.0 \times 10^X$".

Generally speaking, the contact resistance is inversely proportional to the area S ($cm^2$) of the contact. In this case, supposing R ($\Omega$) is contact resistance, the equation R=Rc/S should be satisfied. The constant of proportionality Rc is called "specific contact resistance" and corresponds to contact resistance R when the contact area S is 1 $cm^2$. That is to say, the magnitude of the specific contact resistance does not depend on the contact area S and can be used as an index to evaluating the characteristics of a contact. In the following description, the "specific contact resistance" will be sometimes referred to herein as just "contact resistance".

Specifically, FIG. 4(a) shows the results that were obtained in a situation where the metal layer was just deposited and subjected to no heat treatment at all (i.e., in the case of "as-depo"). On the other hand, FIG. 4(b) shows the results that were obtained in a situation where an Mg layer deposited was thermally treated at 600° C. for 10 minutes within a nitrogen ambient and in a situation where an Al, Au, Pd, Ni or Pt layer deposited was thermally treated at 500° C. for 10 minutes within the nitrogen ambient. This difference in temperature was caused because a non-Mg metal, having a different best heat treatment temperature from Mg, had the lowest contact resistance at 500° C.

As can be seen from FIG. 4(a), the greater the work function of the metal deposited, the lower the contact resistance tended to be. This result coincides with the fact that in a situation where a GaN-based semiconductor device is fabricated on a c-plane substrate, a metal with a large work function (such as Au) is generally used as a material to make a p-electrode.

On the other hand, as for results that were obtained by thermally treating the metal deposited, it can be seen from FIG. 4(b) that with Al, Au, Pd, Ni and Pt, the greater the work function of the metal deposited, the lower the contact resistance. Nevertheless, the present inventors also discovered that despite being a metal with a small work function, Mg still caused a steep decrease in contact resistance. FIG. 4(c) draws a dotted line on the graph shown in FIG. 4(b) to indicate the tendency of various metals other than Mg. In the prior art, people took it for granted that in a situation where no heat treatment was carried out, Mg, having the smallest work function among the metals tested, would have increased contact resistance. Contrary to such a popular misconception, the present inventors discovered that Mg did cause a steep decrease in contact resistance as a result of the heat treatment.

FIG. 5(a) is a graph showing how the specific contact resistance changed with the thickness of an Mg layer in an Mg/Pt electrode (in which a Pt layer was stacked on the Mg layer). In this case, the thickness of the Pt layer yet to be thermally treated was fixed at 75 nm. On the other hand, FIG. 5(b) is a graph showing the specific contact resistance of a Pd/Pt electrode (of which the Pd layer has a thickness of 40 nm and the Pt layer has a thickness of 35 nm) as a comparative example. In this graph, the ordinate represents the heat treatment temperature. The thicknesses of the metal layers other than the Mg layer were measured before the heat treatment.

The data shown in FIG. 5(a) were collected from samples in which the Mg layer was deposited by pulse evaporation process (to be described in detail later). On the other hand, the data shown in FIG. 5(b) were collected from samples in which the Pd or Pt layer was deposited by normal electron beam evaporation process. In every specific example of the present disclosure to be described herein later, the Mg layer was deposited by the pulse evaporation process. In this description, an Mg layer is also deposited on a c-plane GaN layer by the pulse evaporation process. However, every other non-Mg metal layer (such as a Pd, Pt or Au layer) was deposited by normal electron beam evaporation process.

The Mg/Pt electrode and the Pd/Pt electrode are both in contact with the Mg-doped m-plane GaN layer. The m-plane GaN layer that contacts with these electrodes is doped with Mg to a level of $7 \times 10^{19}$ $cm^{-3}$ and to a depth of 20 nm as measured from the surface (i.e., the uppermost surface region with a thickness of 20 nm). On the other hand, the rest of the m-plane GaN layer, of which the depth exceeds 20 nm as measured from the surface, is doped with Mg to a level of $1 \times 10^{19}$ $cm^{-3}$. If the concentration of the p-type dopant is locally increased in this manner in the uppermost surface region of the GaN layer that contacts with the p-electrode, the contact resistance can be reduced to the lowest possible level. On top of that, by adopting such a doping scheme, the in-plane non-uniformity of the current-voltage characteristic can also be reduced. As a result, the variation in drive voltage between respective chips can also be reduced. That is why in every experimental example disclosed in this application, the surface region of the p-type GaN layer that contacts with the electrode is doped with Mg to a level of $7 \times 10^{19}$ $cm^{-3}$ and to a depth of 20 nm as measured from the surface, while the other deeper region is doped with Mg to a level of $1 \times 10^{19}$ $cm^{-3}$. It should be noted that the contact resistance of Mg shown in FIG. 4(b) is higher than that of Mg shown in FIG. 5(a) because in the example shown in FIG. 4(b), the process of locally increasing the doping level of Mg in the surface region was not carried out.

In the graph shown in FIG. 5(a), the abscissa represents the thickness of the thermally treated Mg layer. As will be described later, according to the results of transmission electron microscopy, the thermally treated Mg layer had a decreased thickness compared to the Mg layer yet to be thermally treated. Specifically, an Mg layer that had had a thickness of 7 nm before being subjected to a heat treatment at 600° C. for 10 minutes had its thickness decreased to 2 nm after having been subjected to the heat treatment. In the same way, Mg layers that had had a thickness of 50 nm and a thickness of 20 nm before being subjected to the heat treatment at 600° C. for 10 minutes had their thickness decreased to 45 nm and 15 nm, respectively, after having been subjected to the heat treatment.

The graph of FIG. 5(a) shows the results of experiments that were carried out on samples that had been thermally treated at 600° C. for 10 minutes to show the correlation between the measured value of the contact resistance and the thickness of the Mg layer. The present inventors confirmed via experiments that the contact resistance tended to have a similar Mg layer thickness dependence even under any other heat treatment condition.

The results of experiments the present inventors carried out revealed that once the thickness of the Mg layer exceeded 45 nm, the contact resistance of the Mg/Pt electrode with respect to the m-plane GaN layer was approximately equal to that of the Pd/Pt electrode with respect to the m-plane GaN layer (shown in FIG. 5(b)). On the other hand, if the thickness of the Mg layer was equal to or smaller than 45 nm, the contact resistance of the Mg/Pt electrode on the m-plane GaN layer was lower that of the Pd/Pt electrode on the m-plane GaN layer as shown in FIG. 5(a), thus proving the superiority of the present disclosure over the prior art.

The present inventors confirmed that in a range where the Mg layer had a thickness of 45 nm or less, the thinner the Mg layer, the lower the contact resistance. When the Mg layer thickness decreased to the vicinity of 15 nm, the contact resistance started to drop steeply with the decrease in the thickness of the Mg layer. And when the Mg layer thickness was around 2 nm, the lowest possible contact resistance was achieved.

In view of these considerations, in the semiconductor device to be obtained as a final product by going through every manufacturing process step including the heat treatment, the Mg layer 32 may have a thickness of 45 nm or less, and the Mg layer 32 may have a thickness of 2 nm to 15 nm.

FIGS. 6(a) through 6(c) are photographs showing the surface states of a thermally treated electrode in situations where the Mg layer had thicknesses of 2 nm, 15 nm and 45 nm, respectively. In this case, the thickness of the Mg layer was measured after having been thermally treated at 600° C. for 10 minutes.

As shown in FIG. 6(c), in the sample of which the Mg layer had a thickness of 45 nm, some roughening (or unevenness) was observed on the surface of the electrode. Such roughening of the electrode's surface would be one of the factors that will cause an increase in contact resistance when the thickness of the Mg layer exceeds 45 nm. In addition, once the thickness of the Mg layer exceeded 45 nm, the Mg layer was seen to have locally raised portions. According to the results of transmission electron microscopy, such a phenomenon would have been brought about due to the creation of a gap in the interface between the Mg layer and the GaN layer. This is probably because once the thickness of the Mg layer exceeded 45 nm, the Mg layer got strained so much as to peel off from the interface between the Mg and GaN layers. For these reasons, the thickness of the Mg layer may be set to be 45 nm or less, for example.

It should be noted that if the Mg layer had a thickness of approximately 15 nm or less, the surface of the electrode had an extremely high degree of planarity. Therefore, the Mg layer may have a thickness of 15 nm or less.

Figure 7:
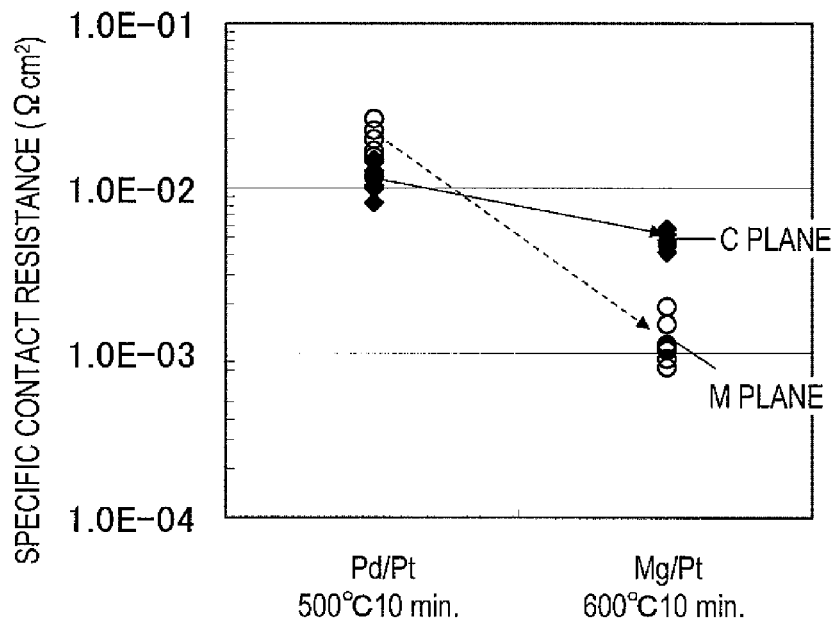
FIG. 7 is a graph showing how the contact resistances of the Mg/Pt electrode and the Pd/Pt electrode changed depending on whether the contact surface was an m plane or a c plane.

FIG. 7 is a graph showing how the (measured values of) contact resistances of the Mg/Pt electrode and the Pd/Pt electrode changed depending on whether the contact surface was an m plane or a c plane. In each of these samples, the electrode was in contact with the p-type GaN layer, which had been doped with Mg having the concentration profile described above.

Before being subjected to the heat treatment, the respective layers had thicknesses shown in the following Table 1:

TABLE 1

| Plane orientation | p-electrode | Thickness (before heat treatment) |
|---|---|---|
| m plane | Mg/Pt | 7 nm/75 nm |
| m plane | Pd/Pt | 40 nm/35 nm |

TABLE 1-continued

| Plane orientation | p-electrode | Thickness (before heat treatment) |
|---|---|---|
| c plane | Mg/Pt | 7 nm/75 nm |
| c plane | Pd/Pt | 40 nm/35 nm |

Their heat treatment temperatures and process times are as shown in the following Table 2:

TABLE 2

| Plane orientation | p-electrode | Heat treatment temperature and process time |
|---|---|---|
| m plane | Mg/Pt | 600° C., 10 minutes |
| m plane | Pd/Pt | 500° C., 10 minutes |
| c plane | Mg/Pt | 600° C., 10 minutes |
| c plane | Pd/Pt | 500° C., 10 minutes |

As is clear from FIG. 7, even when the contact surface was a c plane, the contact resistance of the Mg/Pt electrode slightly decreased compared to the Pd/Pt electrode. Nonetheless, the present inventors discovered that the contact resistance of the Mg/Pt electrode had still decreased significantly.

Figure 8:
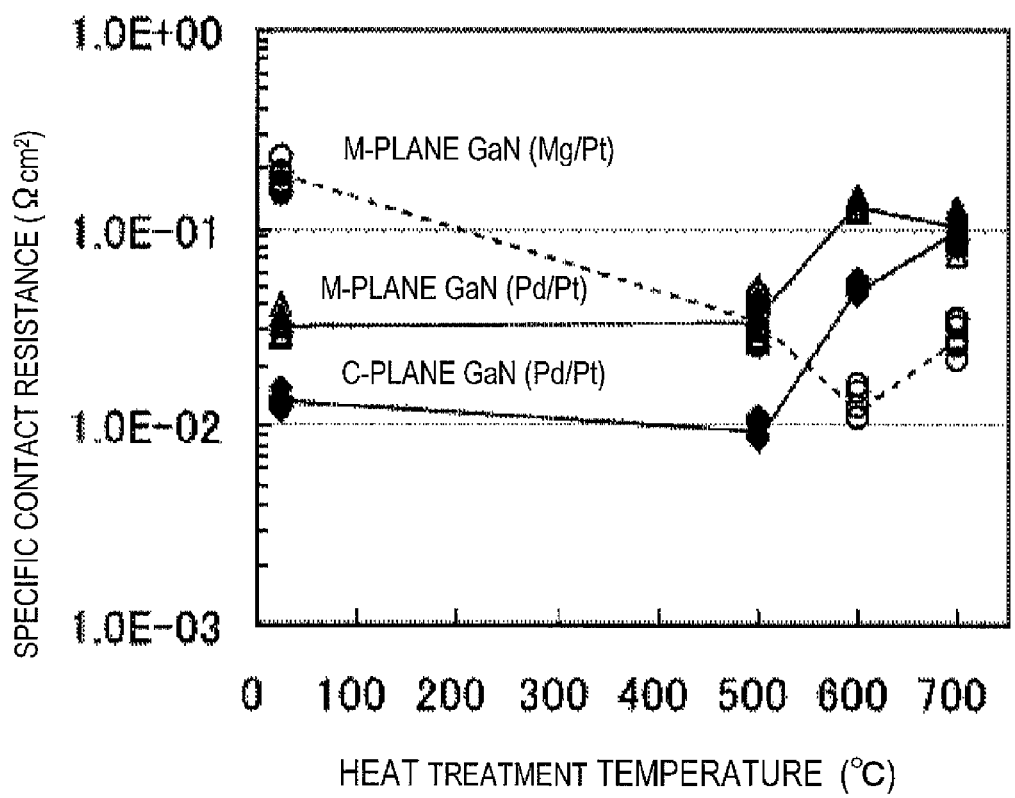
FIG. 8 is a graph showing how the contact resistance depends on the heat treatment temperature.

Next, it will be described with reference to FIG. 8 how the contact resistance depends on the heat treatment temperature. FIG. 8 shows the results that were obtained in a situation where an Mg layer and then a Pt layer were stacked in this order on the m plane of a p-type GaN layer (which will be referred to herein as an "m-plane GaN"). Those results are identified by m-plane GaN (Mg/Pt) in FIG. 8. For the purpose of comparison, FIG. 8 also shows the results that were obtained in a situation where a Pd layer and then a Pt layer were stacked in this order on the p-type m-plane GaN layer. Those results are identified by m-plane GaN (Pd/Pt) in FIG. 8. FIG. 8 further shows the results that were obtained in a situation where a Pd layer and then a Pt layer were stacked in this order on the c plane of a p-type GaN layer (which will be referred to herein as a "c-plane GaN"). Those results are identified by c-plane GaN (Pd/Pt) in FIG. 8. In any case, the p-type GaN layer was doped with Mg so as to have the concentration profile described above.

Before being subjected to the heat treatment, the respective layers had the thicknesses shown in the following Table 3:

TABLE 3

| Plane orientation | p-electrode | Thickness |
|---|---|---|
| m plane | Mg/Pt | 7 nm/75 nm |
| m plane | Pd/Pt | 40 nm/35 nm |
| c plane | Pd/Pt | 40 nm/35 nm |

First of all, in the electrode consisting of Pd/Pt layers, the m-plane GaN had higher contact resistance than the c-plane GaN. Also, in both of the m- and c-plane GaN, the contact resistance increased at a heat treatment temperature exceeding 500° C.

On the other hand, before subjected to the heat treatment, the electrode of the m-plane GaN (Mg/Pt) had higher contact resistance than the electrode consisting of the Pd/Pt layers. This result conforms to a technical commonplace that the smaller the work function of a metal is, the higher its contact resistance will be. However, in the electrode of the m-plane GaN (Mg/Pt), the higher the heat treatment temperature, the lower the contact resistance. And at a heat treatment temperature of 500° C., the contact resistance of the m-plane GaN (Mg/Pt) was equal to or lower than that of the en-plane GaN (Pd/Pt).

Besides, at a temperature exceeding 500° C. (e.g., at 600° C.), the contact resistance of the m-plane GaN (Mg/Pt) further decreased to get equal to, or even lower than, that of the c-plane GaN (Mg/Pt). According to the graph shown in FIG. 8, when the heat treatment temperature was approximately 550° C. or more, the contact resistance of the m-plane GaN (Mg/Pt) was equal to, or even lower than, that of the c-plane GaN (Mg/Pt).

At a heat treatment temperature of 600° C., the contact resistance of the m-plane GaN (Mg/Pt) was lower than those of the m- and c-plane GaN (Mg/Pt) at 600° C. and more specifically decreased to approximately 1.0E-02 $\Omega cm^{-2}$ or the vicinity thereof. Furthermore, at a heat treatment temperature of 700° C., the contact resistance of the m-plane GaN (Mg/Pt) had increased from its resistance at 600° C. but was still lower than the contact resistances of the m- and c-plane GaN (Mg/Pt) at 700° C.

Consequently, the heat treatment temperature of the m-plane GaN (Mg/Pt) may be equal to or higher than 500° C., for example. However, if the heat treatment temperature exceeded 700° C. to reach and go over a predetermined temperature of 800° C., for example, then the film quality of the electrode and the GaN layer would start to deteriorate noticeably. That is why the upper limit may be set to be 700° C. or less, and the heat treatment temperature may be in the vicinity of 600° C. (e.g., 600° C.±50° C.), for example.

Figure 9:
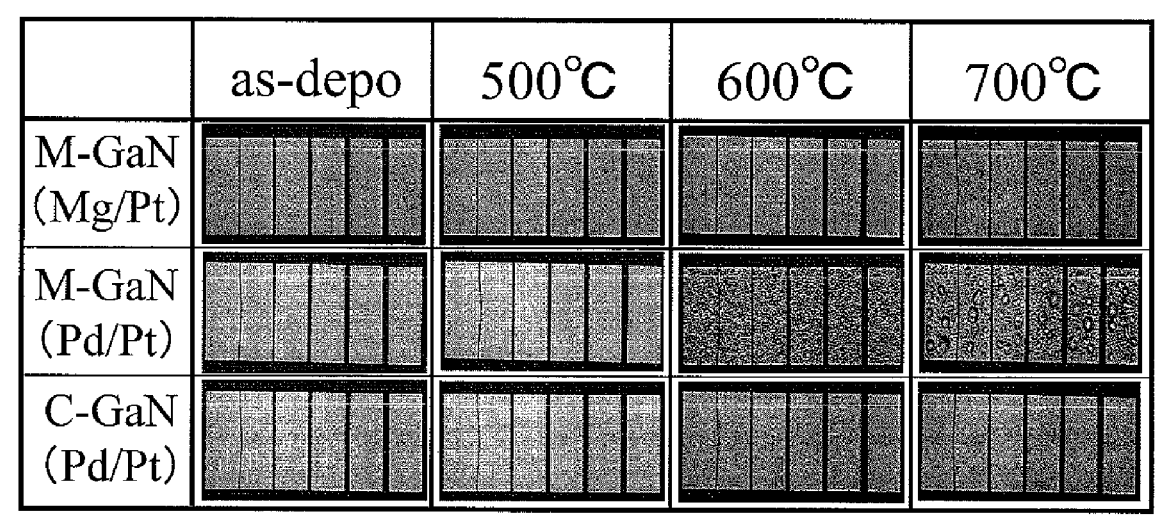

FIG. 9 shows photographs representing the surface states of the electrode that had been thermally treated at respective temperatures. Specifically, the results that were obtained in the as-depo state (without being subjected to the heat treatment) and at heat treatment temperatures of 500° C., 600° C. and 700° C. are shown in FIG. 9.

As can be seen from FIG. 9, if Pd and Pt layers were stacked in this order on a p-type c-plane GaN layer (i.e., in the case of C—GaN (Pd/Pt)), no deterioration was seen on the surface of the metal at any of these heat treatment temperatures of 500° C., 600° C. and 700° C. According to the results of AFM measurements, the surface had arithmetic mean roughness values Ra of about 2 nm, about 2 nm and about 4 nm at 500° C., 600° C. and 700° C., respectively.

On the other hand, if Pd and Pt layers were stacked in this order on a p-type m-plane GaN layer (i.e., in the case of M-GaN (Pd/Pt)), some degree of deterioration such as surface roughening was seen on the surface of the metal at heat treatment temperatures of 600° C. and 700° C. According to the results of AFM measurements, the surface had an Ra of about 30 nm and an Ra of about 77 nm at 600° C. and 700° C., respectively. That is to say, it can be seen that such deterioration of the electrode that has gone through a heat treatment is a problem peculiar to the m-plane GaN electrode, at the present time based on current technologies.

However, if Mg and Pt layers were stacked in this order on a p-type m-plane GaN layer (i.e., in the case of M-GaN (Mg/Pt)), the present inventors confirmed that a very small degree of unevenness was seen at the heat treatment temperature of 700° C. but that the electrode never deteriorated at any of these heat treatment temperatures of 500° C., 600° C. and 700° C. According to the results of AFM measurements, the surface had Ra of about 1.5 nm, about 1.5 nm and about 4.5 nm at 500° C., 600° C., and 700° C., respectively. Thus, good surface states were achieved. And in the structure of this embodiment, the electrode surface may have an Ra of about 4.5 nm or less, or about 1.5 nm or less, for example.

Figure 10:
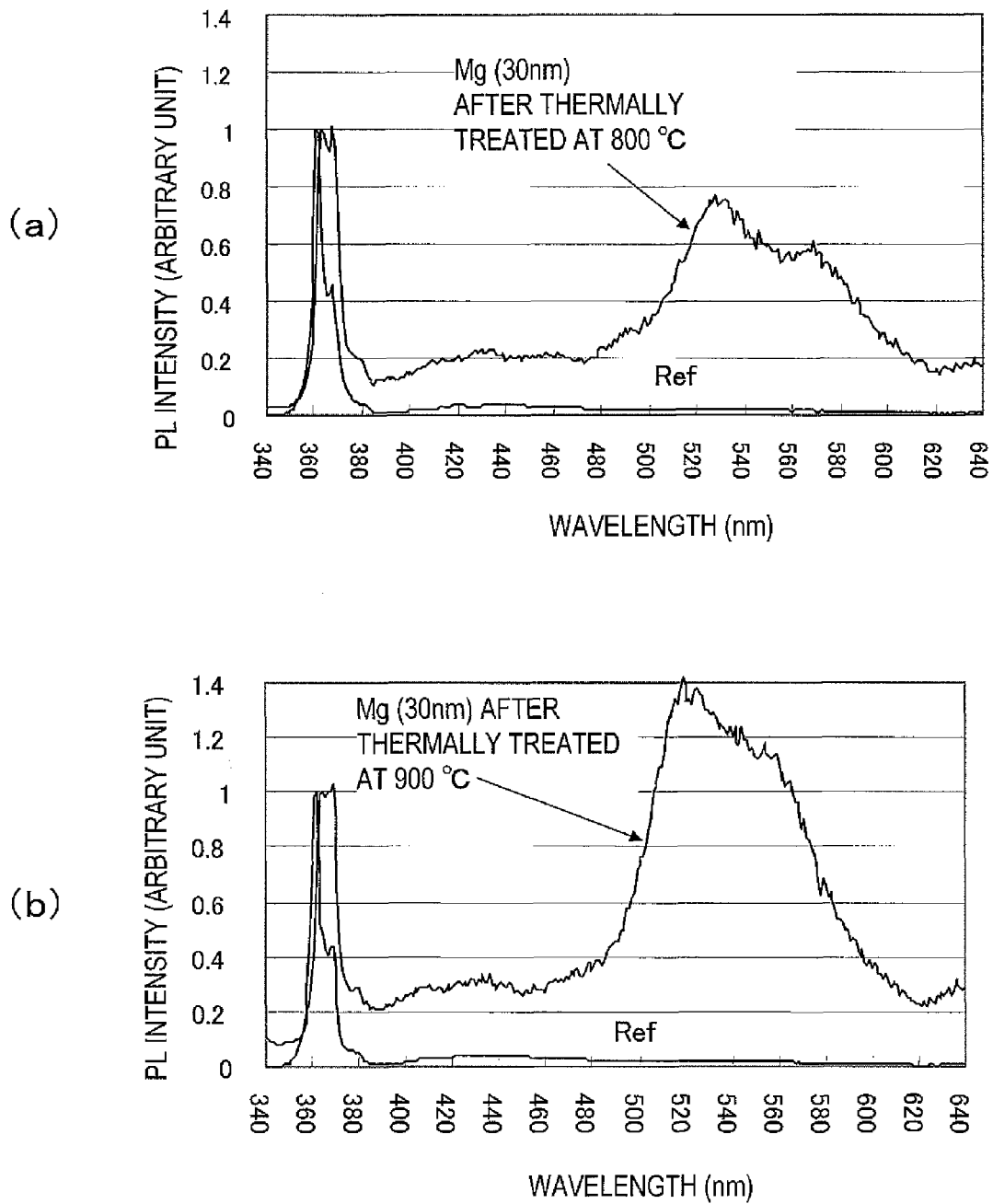
FIGS. 10(a) and 10(b) are graphs showing the photoluminescence intensities of a GaN layer that was thermally treated at 800° C. and 900° C., respectively.

The present inventors deposited an Mg layer to a thickness of 30 nm on a GaN layer, thermally treated it at 800° C. and at 900° C. for 10 minutes, and then measured the photoluminescence of the GaN layer. The results are shown in FIG. 10. Specifically, FIG. 10(a) shows the results of a heat treatment that was carried out at 800° C., while FIG. 10(b) shows the results of a heat treatment that was carried out at 900° C. In FIGS. 10(a) and 10(b), the ordinate represents the PL intensity, which stands for "photoluminescence intensity". In each of these graphs shown in FIGS. 10(a) and 10(b), the curve identified by Ref represents the PL intensity that was obtained before the heat treatment.

First of all, the present inventors discovered and confirmed via experiments that if the heat treatment was carried out at 700° C., or less, the photoluminescence spectrum after the heat treatment remained virtually the same as the one before the heat treatment. On the other hand, if the heat treatment was carried out at 800° C., a photoluminescence called "yellow band", which would have been caused due to the presence of vacancy defects, appeared around 530 nm as shown in FIG. 10(a). And if the heat treatment temperature was further raised, the photoluminescence around 530 nm further increased its intensity as shown in FIG. 10(b), which indicates that the density of such vacancy defects increased. These results reveal that to keep the quality of GaN good enough, the electrode including the Mg layer may be thermally treated at 700° C. or less, for example.

Figure 11:
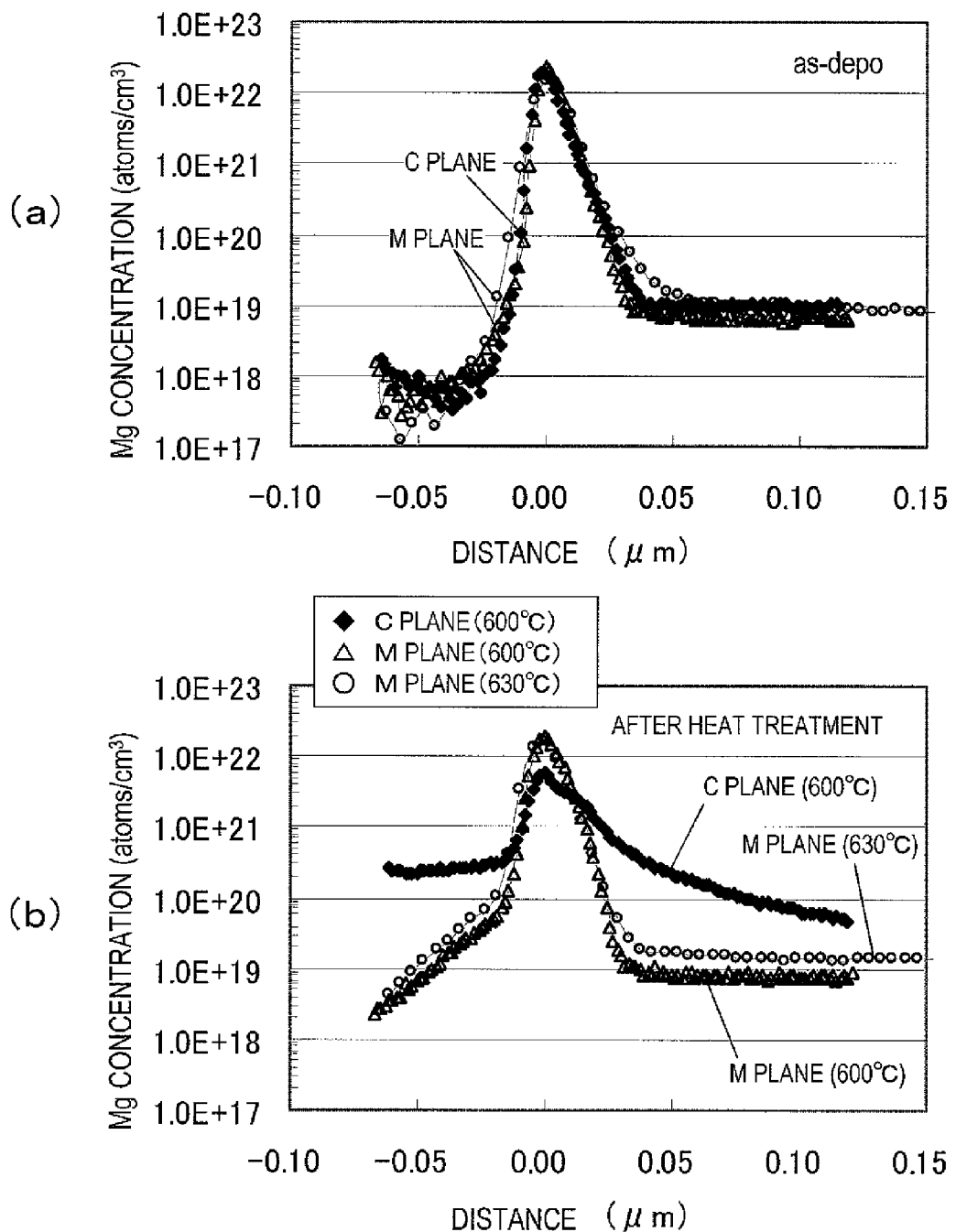
FIGS. 11(a) and 11(b) are profiles of Mg that were obtained in the depth direction of an (Mg/Pt) electrode structure by SIMS analysis.

FIG. 11 shows the profile of Mg atoms in the depth direction, which was measured in an electrode structure (Mg/Pt) with an SIMS (Secondary Ion-microprobe Mass Spectrometer). Specifically, FIG. 11(a) shows the results that were obtained in a situation where an Mg/Pt electrode, in which an Mg layer was stacked on the GaN layer, was not subjected to heat treatment (i.e., in the as-depo state). On the other hand, FIG. 11(b) shows the results that were obtained after a heat treatment. The heat treatment was carried out on c-plane GaN at 600° C. for 10 minutes and on m-plane GaN at 600° C. for 10 minutes and at 630° C. for 10 minutes.

In any of these electrodes, before the heat treatment, the Mg layer had a thickness of 7 nm and the Pt layer had a thickness of 75 nm.

In the graphs shown in FIGS. 11(a) and 11(b), the ordinate represents the Mg concentration and the abscissa represents the distance in the depth direction. In this case, negative abscissas represent sites closer to the electrode, while positive ones represent sites closer to the p-type GaN. The origin (of 0 μm) on the axis of abscissas represents a site where Mg has a peak concentration and substantially corresponds to the interface between the p-type GaN layer and the Mg layer. The same statement will also apply to the graphs shown in FIGS. 12, 13 and 15 to be referred to later.

In the graphs shown in FIGS. 11(a) and 11(b), the solid diamonds ◆ represent data about samples that were formed on the c-plane GaN and that were thermally treated at 600° C., the open triangles ∆ represent data about samples that were formed on the m-plane GaN and that were thermally treated at 600° C., and the open circles ○ represent data about samples that were formed on the m-plane GaN and that were thermally treated at 630° C. The same statement will also apply to the graphs shown in FIGS. 12, 13 and 15 to be referred to later. In any of these cases, the p-type GaN layer yet to be thermally treated had been doped with Mg to a level of $7 \times 10^{19}$ $cm^{-3}$ at a depth of 20 nm as measured from the surface that was in contact with the electrode and to a level of $1 \times 10^{19}$ $cm^{-3}$ in deeper regions as described above.

As shown in FIG. 11(a), in the as-depo state, the Mg profiles were no different, no matter whether the underlying layer was m-plane GaN or c-plane GaN. On the other hand, if an Mg layer was deposited on the GaN layer and then thermally treated, the resultant Mg profiles were quite different as shown in FIG. 11(b).

If the heat treatment was carried out, Mg on the c-plane GaN was seen to have diffused into the p-type GaN layer at rather high concentrations as shown in FIG. 11(b), and was also seen to have diffused into the Pt layer. On the other hand, it was confirmed that Mg on the m-plane GaN hardly diffused into the p-type GaN layer or the Pt layer. More specifically, in the case of the c-plane GaN, Mg diffused deep into not only the Pt layer but also the GaN itself as a result of the heat treatment. On the other hand, in the case of the m-plane GaN, Mg slightly diffused toward the Pt layer but hardly diffused toward the GaN as a result of the heat treatment. The results were almost no different, no matter whether the heat treatment temperature was 600° C. or 630° C. In this manner, a significant difference arose between the diffusion of Mg on the c-plane GaN and that of Mg on the m-plane GaN before and after the heat treatment. The reason has not been quite clear yet but that would have been probably because of a difference in the ordering of uppermost atoms between the c and m planes, a difference in their polarity, and a difference in the density of atoms.

Figure 12:
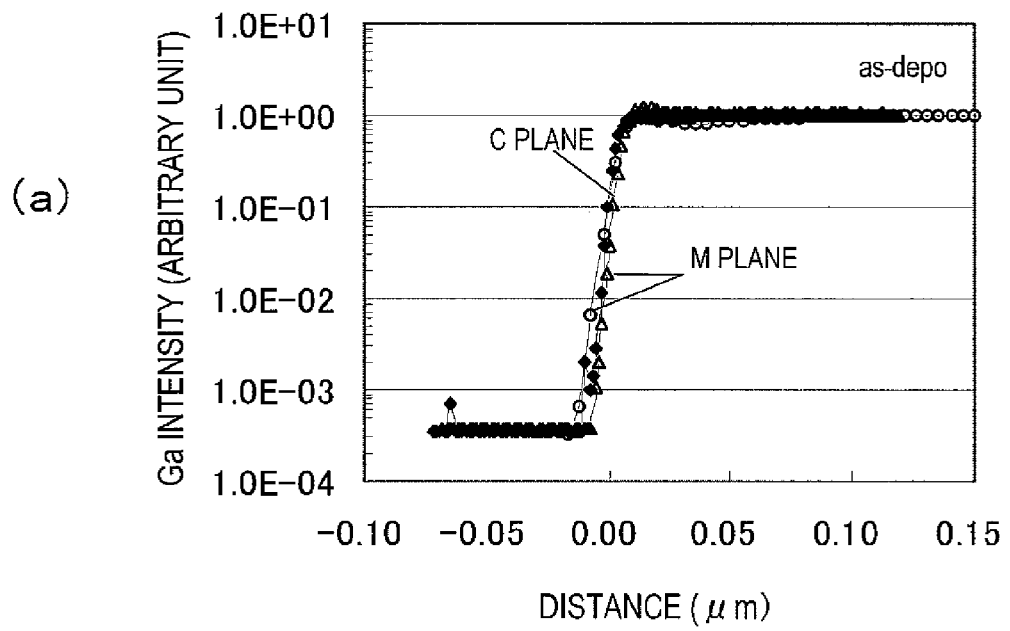
FIGS. 12(a) and 12(b) are profiles of Ga that were obtained in the depth direction of the (Mg/Pt) electrode structure by SIMS analysis.
Figure 12:
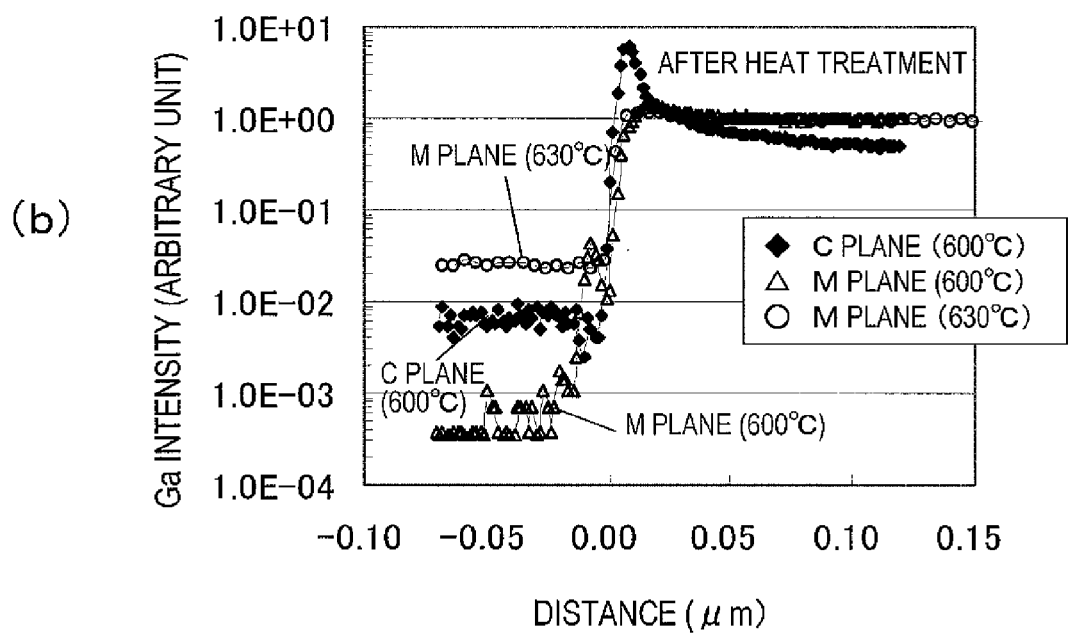

FIG. 12 shows the profile of Ga atoms in the depth direction, which was measured in the electrode structure (Mg/Pt) with an SIMS. Before the heat treatment, the Mg layer had a thickness of 7 nm and the Pt layer had a thickness of 75 nm. The ordinate of this graph represents the signal intensity of the SIMS's detector, which is proportional to the atomic concentration. In FIG. 12, the abscissa representing a distance of 0 μm substantially corresponds to the interface between the p-type GaN layer and the Mg layer. It should be noted that the origin (of 0 μm) on the axis of abscissas represents a site where Mg has a peak concentration. In this case, negative abscissas represent sites closer to the electrode, while positive ones represent sites closer to the p-type GaN. The ordinate is normalized with respect to the concentration of Ga in as-depo GaN crystals as a unity. Also, if calculations are made based on the atomic density of the base, an ordinate representing an intensity of $1\times10^{-3}$ substantially corresponds to a concentration of $1\times10^{19}$ cm$^{-3}$.

FIG. 12(a) shows the results that were obtained in a situation where an Mg/Pt electrode, in which an Mg layer was stacked on the GaN layer, was not subjected to heat treatment (i.e., in the as-depo state). On the other hand, FIG. 12(b) shows the results that were obtained after a heat treatment that had been carried out at temperatures of 600° C. and 630° C. Specifically, the heat treatment was carried out on c-plane GaN at 600° C. for 10 minutes and on m-plane GaN at 600° C. for 10 minutes and at 630° C. for 10 minutes.

As shown in FIG. 12(a), in the as-depo state, the Ga profiles were no different, no matter whether the underlying layer was m-plane GaN or c-plane GaN. On the other hand, if an Mg layer was deposited on the GaN layer and then thermally treated, the resultant Ga profiles were quite different as shown in FIG. 12(b).

Specifically, the present inventors confirmed that if the heat treatment was carried out, Ga diffused into the Mg layer as shown in FIG. 12(b). In a sample in which an Mg layer was deposited on the m-plane GaN and then thermally treated at 600° C., Ga was seen to have diffused into the Mg layer and the contact resistance decreased. The reason has not been quite clear yet but the present inventors did confirm that there was a correlation between the number of Ga atoms diffused into the Mg layer and the contact resistance.

More specifically, in the case of the c-plane GaN, Ga diffused into both the Mg and Pt layers and moved into the electrode even from deep inside GaN crystals. In other words, in the c-plane GaN, Ga atoms diffused significantly almost everywhere from the GaN layer into the electrode. In the m-plane GaN, on the other hand, when the heat treatment temperature was 600° C., it seems that Ga atoms moved only in the vicinity of the interface unlike the c-plane GaN. Compared to a c-plane, it would be less easy for the atoms to move freely from an m plane. Even in the m-plane GaN, however, if the heat treatment temperature was 630° C., Ga atoms diffused into the entire Mg and Pt layers. It should be noted that the m-plane contact resistance was lower at a heat treatment temperature of 600° C. than at 630° C. This is probably because at a heat treatment temperature of 600° C., it would be hard for nitrogen atoms to diffuse from the m plane as will be described later, and therefore, Ga vacancies would act as acceptors as a result. On the other hand, at a heat treatment temperature of 630° C., a greater number of nitrogen atoms would diffuse toward the electrode than at 600° C.

Figure 13:
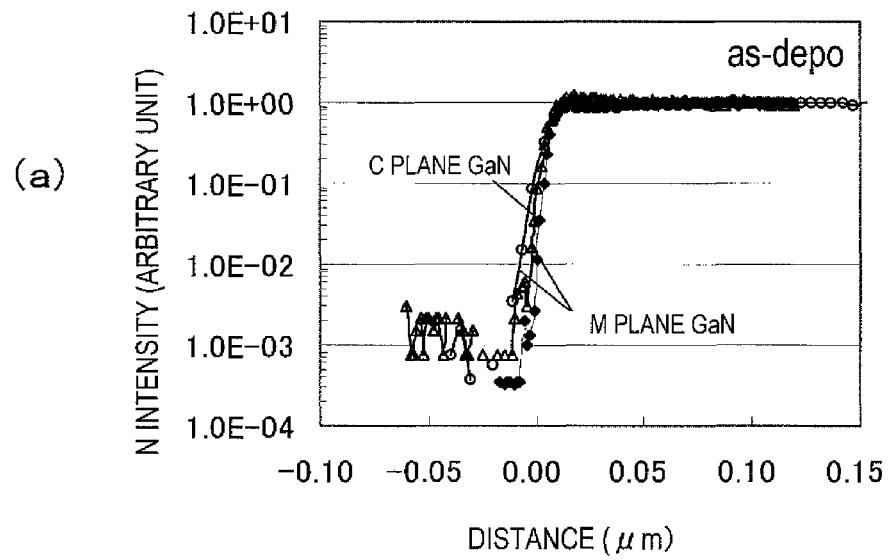
FIGS. 13(a) and 13(b) are profiles of N that were obtained in the depth direction of the (Mg/Pt) electrode structure by SIMS analysis.
Figure 13:
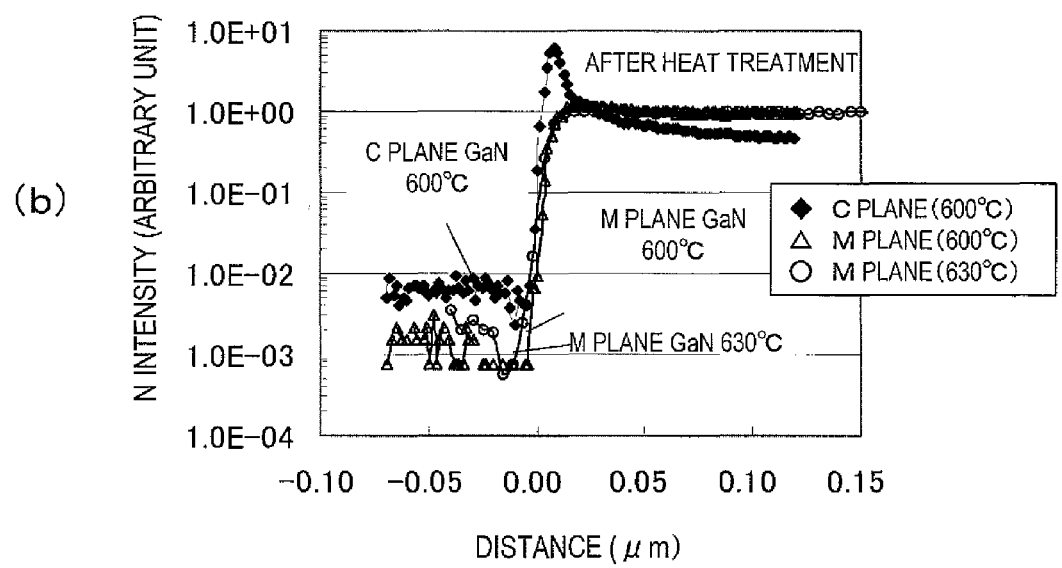

FIG. 13(a) is a graph showing the profile of nitrogen atoms in the depth direction in an Mg/Pt electrode yet to be subjected to a heat treatment, while FIG. 13(b) is a graph showing the profile of nitrogen atoms in the depth direction in the Mg/Pt electrode that has been subjected to the heat treatment. Before the heat treatment, the Mg layer had a thickness of 7 nm and the Pt layer had a thickness of 75 nm. In the graphs shown in FIGS. 13(a) and 13(b), the ordinate represents the N intensity, while the abscissa represents the distance in the depth direction. Specifically, an N intensity of $1\times10^{-3}$ substantially corresponds to an N concentration of $1\times10^{19}$ cm$^{-3}$. In this case, negative abscissas represent sites closer to the electrode, while positive ones represent sites closer to the p-type GaN. In FIG. 13, the origin of the axis of abscissas (0 μm) substantially corresponds to the interface between the p-type GaN layer and the Mg layer. The electrode structure and the p-type GaN doping conditions are the same as what has already been described for the samples with reference to FIG. 11.

It can be seen from FIG. 13(a) that in samples in which no heat treatment was carried out after the evaporation process, nitrogen atoms did not diffuse toward the electrode, no matter whether the electrode had been formed on the c-plane GaN or the m-plane GaN.

On the other hand, it was confirmed that in the electrode on the c-plane GaN that had been thermally treated, nitrogen atoms diffused toward the electrode as shown in FIG. 13(b). In the electrode on the m-plane GaN, however, the nitrogen atoms hardly diffused toward the electrode even after the heat treatment. That is to say, as for the m-plane GaN, only Ga atoms diffused toward the electrode but nitrogen atoms didn't. Meanwhile, as for the c-plane GaN, both Ga atoms and nitrogen atoms did diffuse toward the electrode. If Ga atoms diffuse toward the electrode from p-type GaN, then the number of Ga atoms will be insufficient on the uppermost surface of p-type GaN, thus producing Ga vacancies there. Such Ga vacancies will act as a sort of acceptors. That is why if the number of Ga vacancies increases in the vicinity of the interface between the electrode and the p-type GaN, then holes will pass through the Schottky barrier of that interface more easily due to a so-called "tunneling" phenomenon. If not only those Ga atoms but also nitrogen atoms diffuse toward the electrode, however, the number of nitrogen atoms will also be insufficient on the uppermost surface of the p-type GaN. That is to say, nitrogen vacancies will also be produced there. Those nitrogen vacancies will act like donors and will produce charge compensation with respect to the Ga vacancies.

That is why if not just Ga atoms but also nitrogen atoms diffuse toward the electrode as in the c-plane GaN, the contact resistance will no longer decrease.

Next, the relation between N (nitrogen) and Ga concentrations in an Mg layer will be described in detail. As shown in FIG. 12(b), if the heat treatment was carried out at 600° C., the concentration of Ga that was detected in the Mg layer on the m-plane GaN layer with an SIMS was 4×1.0 E-02. The SIMS detected intensity is proportional to its atomic concentration. That is why supposing the base of the GaN layer has a Ga concentration of approximately $1\times10^{22}$ cm$^{-3}$, Ga atoms would be contained in a concentration of approximately $4\times10^{19}$ cm$^{-3}$ in the Mg layer. On the other hand, if the heat treatment was carried out at 630° C., the SIMS detected intensity was 3×1.0 E-02. According to the same supposition, atoms would be contained in a concentration of approximately $3\times10^{19}$ cm$^{-3}$ in the Mg layer on the m-plane GaN.

Furthermore, no matter whether the heat treatment was carried out at 600° C. or 630° C., the concentration of N (nitrogen) atoms that was detected in the Mg layer on the m-plane GaN with an SIMS was 1×1.0 E-03, which is the limit of responsivity, as shown in FIG. 13(b). According to the same supposition, N (nitrogen) atoms would be contained in a concentration of $1\times10^{18}$ cm$^{-3}$ or less in the Mg layer on the m-plane GaN. These results reveal that the Ga atom concentration in the Mg layer on the m-plane GaN is at least one-digit greater than (i.e., at least 10 times as high as) the N atom concentration there.

On the other hand, in the Mg layer on the c-plane GaN layer, both Ga and N had an SIMS detected intensity of 1E-2, and therefore, would have been contained there in a concentration of approximately $1\times10^{19}$ cm$^{-3}$. That is to say, in the Mg layer on the c-plane GaN layer, the Ga atoms and N atoms had approximately the same concentration.

These elements (namely, Mg, Ga, N and Pt) would behave in a similar manner even if part of Ga is replaced with Al or In in the GaN layer that contacts with the Mg layer. Their behavior would also be the same even if the GaN-based semiconductor layer that contacts with the Mg layer is doped with a non-Mg element as a dopant.

Figure 14:
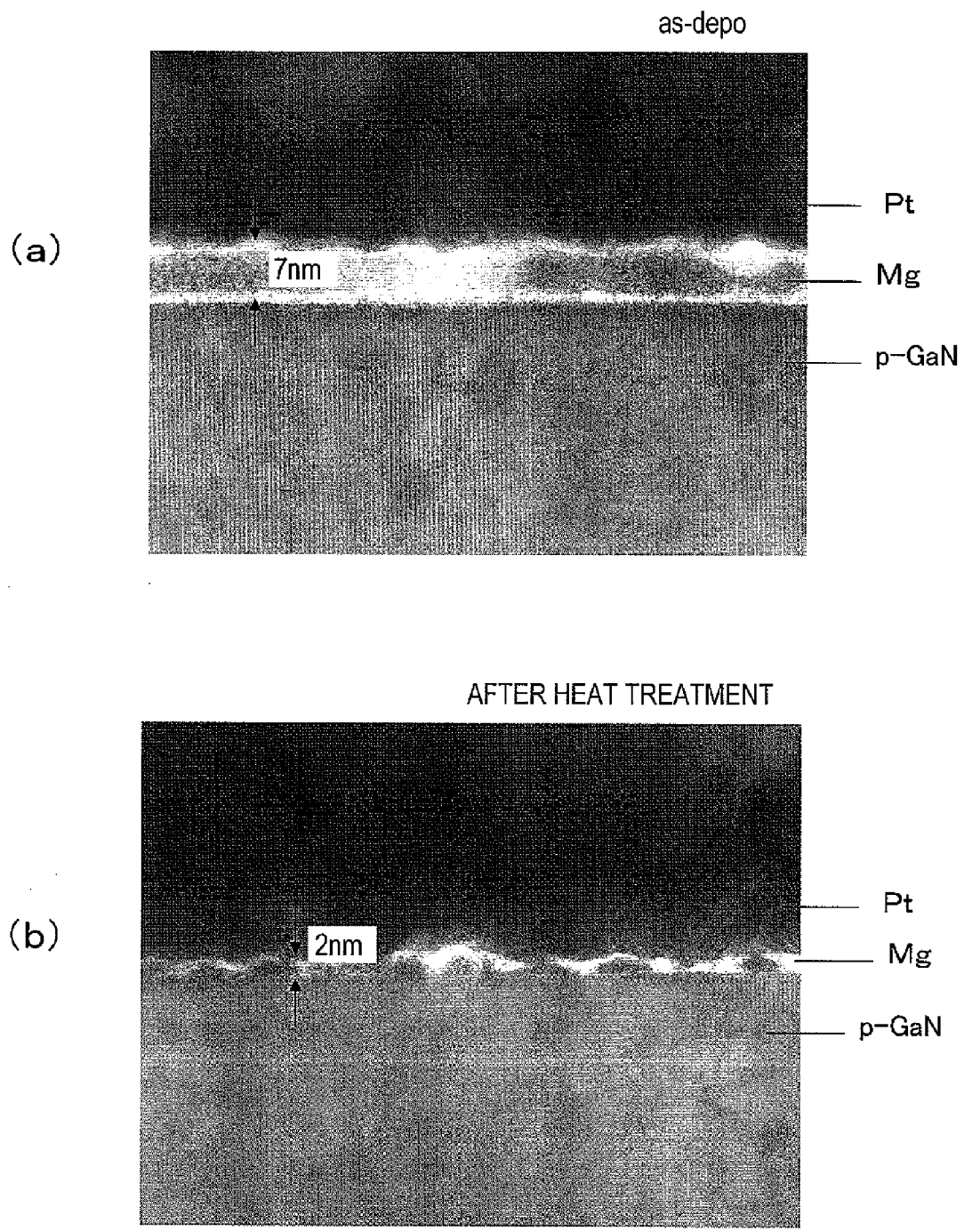
FIGS. 14(a) and 14(b) show cross-sectional transmission electron microscope (TEM) photographs of an (Mg/Pt) electrode structure in which an Mg layer was deposited on an m-plane GaN layer as substitutes for drawings.

Next, look at FIG. 14, which shows cross-sectional transmission electron microscope (TEM) photographs of an (Mg/Pt) electrode structure in which an Mg layer was deposited on an m-plane GaN layer. Specifically, FIG. 14(a) shows the result that was obtained without conducting a heat treatment (i.e., in the as-depo state), while FIG. 14(b) shows the result that was obtained after a heat treatment had been carried out at 600° C. for 10 minutes.

In this example, the Mg layer was deposited to a thickness of 7 nm on GaN crystals as shown in FIG. 14(a). After the heat treatment, the Pt layer corroded the Mg layer, thus reducing the thickness of the Mg layer to 2 nm as shown in FIG. 14(b).

As can be seen from FIG. 14(b), although the Mg layer (i.e., the layer 32 shown in FIG. 3(a)) had a small thickness (of 2 nm, for example), the presence of the Mg layer (i.e., the layer 32 shown in FIG. 3(a)), consisting essentially of Mg that had neither been alloyed nor absorbed by the Pt layer (i.e., the layer 34 shown in FIG. 3(a)), was still confirmed. The presence of this thin Mg layer 32 would be one of major factors contributing to a reduction in the contact resistance of an m-plane GaN that has been extremely high in the prior art.

Figure 15:
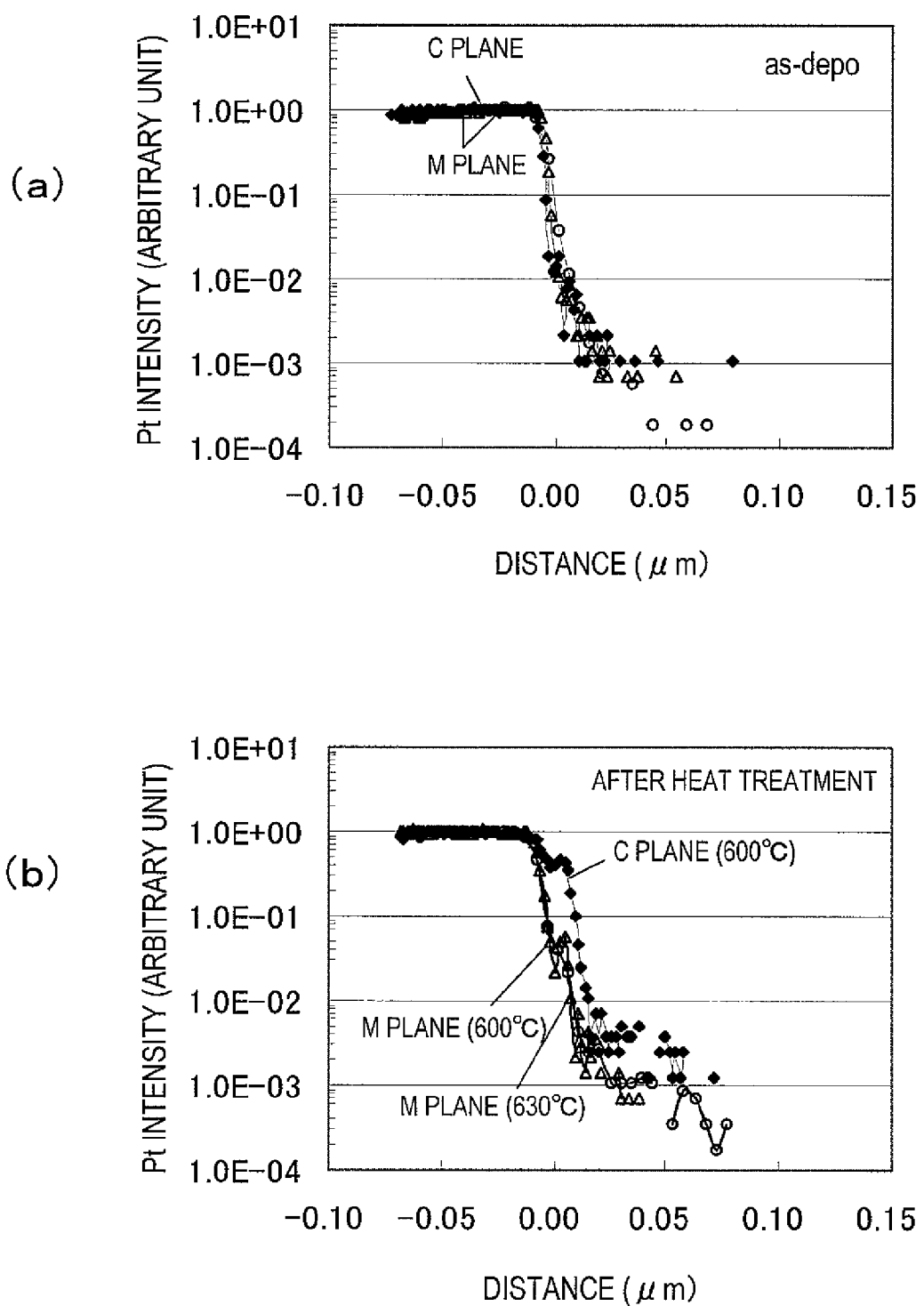
FIGS. 15(a) and 15(b) are profiles of Pt that were obtained in the depth direction of the (Mg/Pt) electrode structure by SIMS analysis.

FIG. 15 shows the profile of Pt atoms in the depth direction, which was measured in an electrode structure (Mg/Pt) with an SIMS. Just like the SIMS results described above, FIGS. 15(a) and 15(b) show the results that were obtained without conducting a heat treatment (i.e., in the as-depo state) and the results that were obtained after a heat treatment. Before the heat treatment, the Mg layer had a thickness of 7 nm and the Pt layer had a thickness of 75 nm. In the graphs shown in FIGS. 15(a) and 15(b), the ordinate represents the Pt intensity, while the abscissa represents the distance in the depth direction. Specifically, a Pt intensity of $1\times10^{-3}$ substantially corresponds to a Pt concentration of $1\times10^{19}$ cm$^{-3}$. In this case, negative abscissas represent sites closer to the electrode, while positive ones represent sites closer to the p-type GaN. In FIG. 15, the origin of the axis of abscissas (0 μm) substantially corresponds to the interface between the p-type GaN layer and the Mg layer. The electrode structure and the p-type GaN doping conditions are the same as what has already been described for the samples with reference to FIG. 11.

As shown in FIG. 15(a), in the as-depo state, the Pt profiles were no different, no matter whether the underlying layer was m-plane GaN or c-plane GaN. On the other hand, it can be seen from FIG. 15(b) that on the c-plane GaN, Pt diffused toward GaN after the heat treatment. Nevertheless, it was confirmed that as for the m-plane GaN, the Pt profiles hardly changed even after the heat treatment and Pt hardly diffused into the GaN layer. More specifically, as for the c-plane GaN, a lot of Pt diffused toward the Mg layer as a result of the heat treatment. As for the m-plane GaN, on the other hand, just a small number of Pt (which was approximately only a tenth compared to the c-plane GaN) diffused toward the Mg layer as a result of the heat treatment. The results were almost the same, no matter whether the heat treatment temperature was 600° C. or 630° C.

These results reveal that according to the structure (Mg/Pt) of this embodiment, in a region where Mg was in contact with the GaN layer, their alloy was produced much less than in the case of Au.

Figure 16:
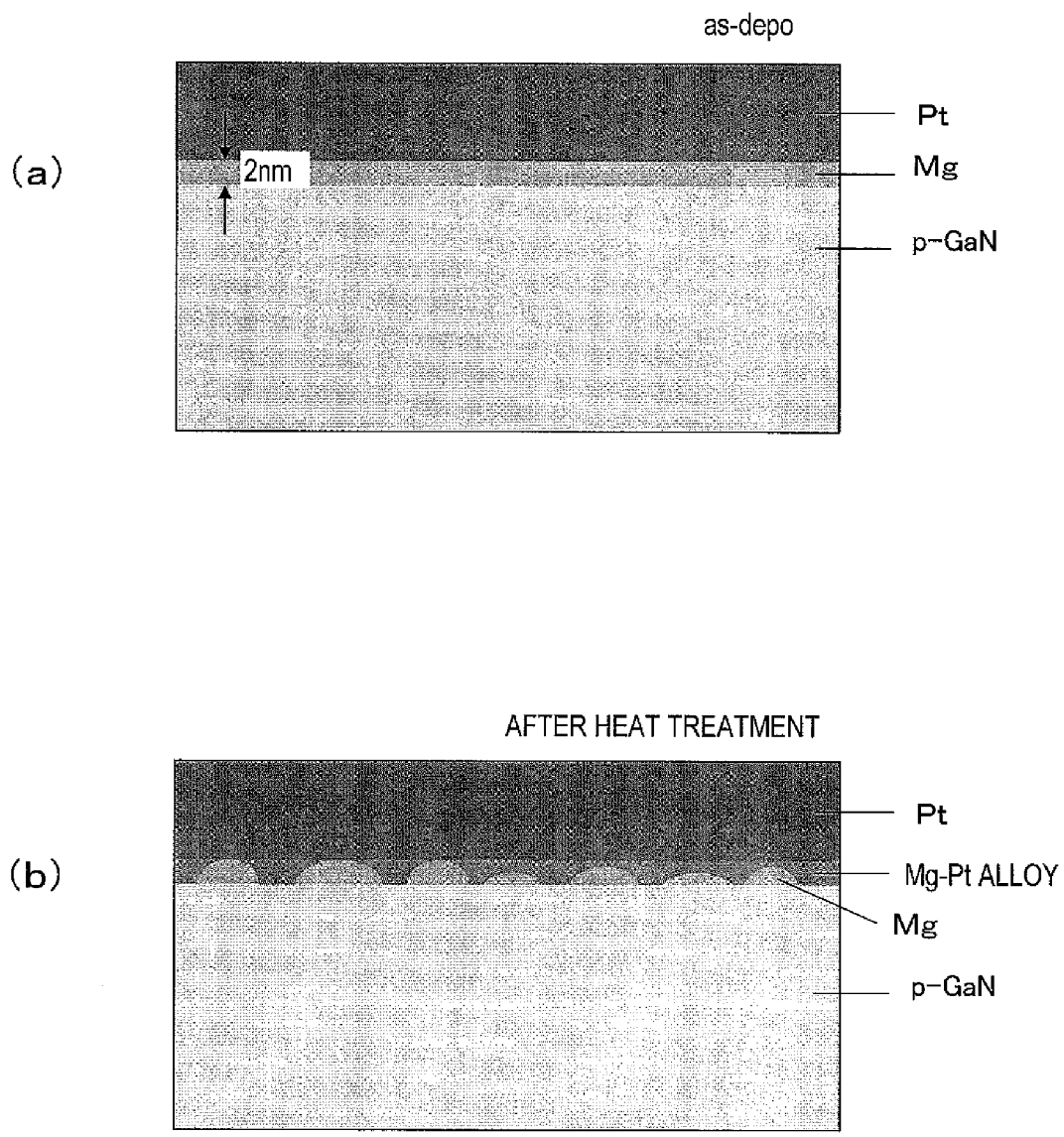
FIG. 16(a) illustrates a cross-sectional structure of an Mg/Pt electrode (in which an Mg layer was deposited on an m-plane GaN layer) yet to be subjected to a heat treatment.
FIG. 16(b) illustrates a cross-sectional structure of the Mg/Pt electrode thermally treated.

The present inventors made a sample in which an Mg layer was deposited to a thickness of 2 nm on an m-plane GaN and then thermally treated at 600° C. for 10 minutes. And we observed cross sections of that sample with a transmission electron microscope (TEM). FIG. 16(a) is a schematic representation illustrating the structure of an Mg/Pt electrode yet to be subjected to a heat treatment, while FIG. 16(b) is a schematic representation illustrating the structure of the Mg/Pt electrode thermally treated. Each of these drawings was drawn based on a cross-sectional TEM photograph.

If the Mg layer as deposited was thicker than 5 nm, the thickness of the Mg layer decreased after having been thermally treated at 600° C. for 10 minutes. However, the Mg layer was still present as a substantially continuous film even after the heat treatment. On the other hand, it was confirmed that if the Mg layer as deposited had a thickness of approximately 2 nm, sometimes there were islands of Mg, which had not been absorbed into an Mg—Pt alloy, after the heat treatment had been carried out at 600° C. for 10 minutes as shown in FIG. 16(b). Also, if the thickness of the Mg layer as-deposited is as small as approximately 2 nm, the Mg layer eventually obtained could have any of various morphologies according to the conditions of the heat treatment conducted.

It should be noted that the "Mg layer" could also refer herein to a group of such a huge number of islands of Mg on the surface of a p-type semiconductor region. Alternatively, the "Mg layer" could even be a film with a lot of openings (such as a porous film). In this manner, as long as Mg that has not been corroded by Pt contacts with the surface of a p-type semiconductor region (that is an m plane), the contact resistance can be reduced sufficiently effectively.

Also, even if an Mo layer or a Pd layer is deposited in place of the Pt layer on the Mg layer, the contact resistance could also be reduced substantially no less effectively. To achieve that effect of reducing the contact resistance, the point is that an Mg layer and a GaN-based semiconductor should contact with each other and that a metal on the Mg layer should be a material that would make an alloy with Mg less easily than Au does.

Hereinafter, the configuration of this embodiment will be described in further detail with reference to FIG. 3(a) again.

As shown in FIG. 3(a), the light-emitting device 100 of this embodiment includes an m-plane GaN substrate 10 and an $Al_uGa_vIn_wN$ layer (where u+v+w=1, u≥0, v≥0 and w≥0) 22 that has been formed on the substrate 10. In this specific example, the m-plane GaN substrate 10 is an n-type GaN substrate with a thickness of 100 µm, for example, and the $Al_uGa_vIn_wN$ layer 22 is an n-type GaN layer with a thickness of 2 µm, for example. On the $Al_uGa_vIn_wN$ layer 22, stacked is an active layer 24. In other words, a semiconductor multilayer structure 20 including at least the active layer 24 has been formed on the m-plane GaN substrate 10.

In the semiconductor multilayer structure 20, an active layer 24 including an $Al_aIn_bGa_cN$ layer (where a+b+c=1, a≥0, b≥0 and c≥0) has been formed on the $Al_xGa_yIn_zN$ layer 22. The active layer 24 consists of InGaN well layers with an In mole fraction of approximately 25% and GaN barrier layers, both the well layers and the barrier layers may have a thickness of 9 nm each, and the well layers may have a well layer period of three. On the active layer 24, stacked is an $Al_dGa_eN$ layer (where d+e=1, d≥0 and e≥0) 26 of the second conductivity type (which may be p-type, for example), which may be an AlGaN layer with an Al mole fraction of 10% and may have a thickness of 0.2 µm. In this embodiment, the $Al_dGa_eN$ layer 26 is doped with Mg as a p-type dopant to a level of approximately $10^{18}$ cm$^{-3}$, for example. Also, in this example, an undoped GaN layer (not shown) is interposed between the active layer 24 and the $Al_dGa_eN$ layer 26.

Furthermore, in this example, on the $Al_dGa_eN$ layer 26, stacked is a GaN layer (not shown) of the second conductivity type (which may be p-type, for example). In addition, on the contact layer of p$^+$-GaN, stacked in this order are an Mg layer 32 and a Pt layer 34. And this stack of the Mg layer 32 and the Pt layer 34 is used as an electrode (i.e., a p-electrode) 30.

This semiconductor multilayer structure 20 further has a recess 42 that exposes the surface of the $Al_uGa_vIn_wN$ layer 22. And an electrode 40 (n-electrode) has been formed on the $Al_uGa_vIn_wN$ layer 22 at the bottom of the recess 42, which may have a width (or diameter) of 20 µm and a depth of 1 µm, for example. The electrode 40 may have a multilayer structure consisting of Ti, Al and Pt layers, which may have thicknesses of 5 nm, 100 nm and 10 nm, respectively.

The present inventors discovered that the nitride-based semiconductor light-emitting device 100 of this embodiment could have an operating voltage Vop that was approximately 1.5 V lower than that of a conventional m-plane LED with a Pd/Pt electrode, and therefore, could cut down the power dissipation as a result.

Hereinafter, it will be described with reference to FIG. 3(a) once again how to fabricate the nitride-based semiconductor light-emitting device 100 of this embodiment.

First of all, an m-plane substrate 10 is prepared. In this embodiment, a GaN substrate is used as the substrate 10. The GaN substrate of this embodiment is obtained by HVPE (hydride vapor phase epitaxy).

For example, a thick GaN film is grown to a thickness of several nanometers on a c-plane sapphire wafer, and then diced perpendicularly to the c plane (i.e., parallel to the m plane), thereby obtaining m-plane GaN substrates. However, the GaN substrate does not have to be prepared by this particular method. Alternatively, an ingot of bulk GaN may be made by a liquid phase growth process such as a sodium flux process or a melt growth process such as an ammono-thermal process and then diced parallel to the m-plane.

The substrate 10 does not have to be a GaN substrate but may also be a gallium oxide substrate, an SiC substrate, an Si substrate or a sapphire substrate, for example. To grow an m-plane GaN-based semiconductor on the substrate by epitaxy, the principal surface of the SiC or sapphire substrate may be an m plane, too. However, in some instances, a-plane GaN could grow on an r-plane sapphire substrate. That is why according to the growth conditions, the surface on which the crystal growth should take place does not always have to be an m plane. In any case, at least the surface of the semiconductor multilayer structure 20 should be an m plane. In this embodiment, crystal layers are formed one after another on the substrate 10 by MOCVD (metalorganic chemical vapor deposition) process.

Next, an $Al_uGa_vIn_wN$ layer 22 is formed on the m-plane GaN substrate 10. As the $Al_uGa_vIn_wN$ layer 22, AlGaN may be deposited to a thickness of 3 µm, for example. A GaN layer may be deposited by supplying TMG (Ga(CH$_3$)$_3$), TMA (Al(CH$_3$)$_3$) and NH$_3$ gases onto the m-plane GaN substrate 10 at 1100° C., for example.

Subsequently, an active layer 24 is formed on the $Al_uGa_vIn_wN$ layer 22. In this example, the active layer 24 has a GaInN/GaN multi-quantum well (MQW) structure in which Ga$_{0.9}$In$_{0.1}$N well layers and GaN barrier layers, each having a thickness of 9 nm, have been stacked alternately to have an overall thickness of 81 nm. When the Ga$_{0.9}$In$_{0.1}$N well layers are formed, the growth temperature may be lowered to 800° C. to introduced In.

Thereafter, an undoped GaN layer is deposited to a thickness of 30 nm, for example, on the active layer 24, and then an $Al_dGa_eN$ layer 26 is formed on the undoped GaN layer. As the $Al_dGa_eN$ layer 26, p-Al$_{0.14}$Ga$_{0.86}$N is deposited to a thickness of 70 nm by supplying TMG, NH$_3$, TMA, TMI gases and Cp$_2$Mg (cyclopentadienyl magnesium) gas as a p-type dopant.

Next, a p-GaN contact layer is deposited to a thickness of 0.5 µm, for example, on the $Al_dGa_eN$ layer 26. In forming the p-GaN contact layer, Cp$_2$Mg is supplied as a p-type dopant.

Thereafter, respective portions of the p-GaN contact layer, the $Al_dGa_eN$ layer 26, the undoped GaN layer, and the active layer 24 are removed by performing a chlorine-based dry etching process, thereby making a recess 42 and exposing a region of the $Al_xGa_yIn_zN$ layer 22 where an n-electrode will be formed. Then, Ti/Pt layers are deposited as an n-electrode 40 on the region reserved for an n-type electrode at the bottom of the recess 42.

Subsequently, an Mg layer 32 is formed on the p-GaN contact layer and then a Pt layer 34 is stacked on the Mg layer 32, thereby forming a p-electrode 40. In this embodiment, a technique for performing an evaporation process while evaporating the material metal in pulses (i.e., a so-called "pulse evaporation process") is used to form the Mg layer 32. More specifically, metal Mg contained in a crucible in a vacuum (of 5×10$^{-6}$ Torr, for example) is irradiated with pulses of electron beam, thereby evaporating the material metal in pulses. Some of the molecules or atoms of that material metal are deposited on the p-GaN contact layer, thereby forming an Mg layer 32. Those pulses may have a pulse width of 0.5 seconds and may be applied repeatedly at a frequency of 1 Hz. The pulse width may fall within the range of 0.005 seconds through 5 seconds and the pulse frequency may fall within the range of 0.1 Hz through 100 Hz. By adopting such a technique, a dense film of quality could be formed as the Mg layer 32. The Mg layer had such high density probably because by performing such a pulse evaporation, Mg atoms or a cluster of Mg atoms that collided against the p-GaN contact layer would have their kinetic energy increased. That is to say, when irradiated with an electron beam, a portion of the material Mg instantaneously turn into high-energy Mg atoms and vaporize or evaporate. Then, those Mg atoms reach the p-GaN contact layer. On reaching the p-GaN contact layer, the Mg atoms make migration, thereby forming a dense and homogeneous Mg thin film at an atomic level. By applying a pulse of an electron beam, an Mg thin film consisting of approximately one to twenty atomic layers is formed. And by applying multiple pulses of electron beams a number of times, those Mg thin films will be stacked one upon the other on the p-GaN contact layer, thereby forming an Mg layer 32 to a desired thickness. The electron beam may have a peak intensity that is high enough to supply the Mg atoms with such kinetic energy that would cause those Mg atoms adsorbed to migrate easily. Also, the driving power of the electron gun may be determined so that the Mg thin film is deposited to a thickness of 20 atomic layers (corresponding to approximately 5 nm) or less per pulse of an electron beam. This is because if the Mg thin film deposited per pulse of the electron beam were thicker than 20 atomic layers, then it would be difficult to obtain a dense and homogenous Mg thin film. The deposition rate may be five atomic layers or less per pulse of the electron beam. The reason is that if there were too many Mg atoms, those Mg atoms would collide against each other while migrating and would lose their kinetic energy.

Generally speaking, Mg is an element that gets oxidized easily when exposed to water or the air. When put in the air, an Mg thin film that has been deposited on a supporting substrate by a normal evaporation process will get oxidized quickly. As a result, the Mg thin film will gradually lose its metallic gloss and will eventually get crumbly and peel off from its supporting member. On the other hand, the Mg layer 32 that has been formed by the method of this embodiment (i.e., the pulse evaporation process) is highly dense and homogenous at an atomic level and has a structure, of which the atomic ordering is so aligned that it looks as if it had been grown epitaxially. On top of that, since it has almost no pinholes that would cause the oxidation, the layer will get hardly oxidized. That is why even if left in the air for a few months, the layer can still maintain a shiny mirror surface.

Also, in general, Mg will vaporize instantaneously by nature once its temperature has exceeded its melting point. For that reason, it is very difficult to precisely control the thickness of an Mg thin film to deposit on the order of nanometers by adjusting the deposition rate of the Mg thin film. On the other hand, the Mg layer 32 that has been formed by the method of this embodiment can have its thickness controlled very precisely on the order of nanometers by appropriately setting the duration of a pulsed electron beam radiated.

It should be noted that the method of this embodiment could also be used effectively to deposit an Mg thin film on an Si substrate or a glass substrate. That is why the method of this embodiment can be used to form an Mg thin film on not just GaN but also any of various other substrates. And the method of this embodiment can be used effectively to form an electrode in the field of semiconductor processing, among other things. Also, according to the method of this embodiment, there is no need to heat either the substrate or the supporting member while an Mg thin film is being deposited thereon by evaporation. For that reason, a highly dense and homogenous Mg thin film can be deposited at around room temperature even on a substrate or supporting member that has been formed in a shape that makes it either impossible or difficult to heat it.

Furthermore, the Mg layer 32 that has been formed by the method of this embodiment can still maintain good stability even when thermally treated at a temperature of 600° C. or more.

This embodiment uses a technique for depositing an Mg layer 32 while evaporating the material metal (i.e., metal Mg) in pulses. However, as long as the Mg layer 32 can be formed, any other technique can also be adopted. As an alternative method for forming such a dense Mg layer of quality, a thermal CVD process or a molecular beam epitaxy (MBE) could also be used.

Optionally, the substrate 10 and a portion of the $Al_uGa_vIn_wN$ layer 22 could be removed after that by some technique such as laser lift-off, etching or polishing. In that case, either only the substrate 10 or the substrate 10 and a portion of the $Al_uGa_vIn_wN$ layer 22 could be removed selectively. It is naturally possible to leave the substrate 10 and the $Al_uGa_vIn_wN$ layer 22 as they are without removing them. By performing these process steps, the nitride-based semiconductor light-emitting device 100 of this embodiment is completed.

In the nitride-based semiconductor light-emitting device 100 of this embodiment, when a voltage is applied to between the n- and p-electrodes 40 and 30, holes are injected from the p-electrode 30 into the active layer 24 and electrons are injected from the n-electrode 40 into the active layer 24, thus producing photoluminescence with a wavelength of about 450 nm.

Figure 17:
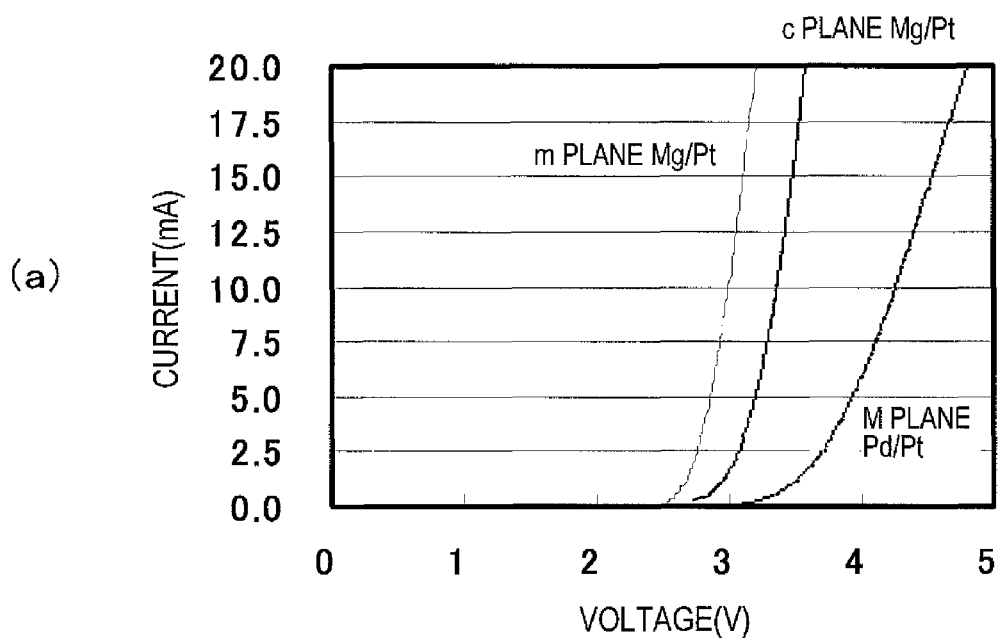
FIG. 17(a) is a graph showing the current-voltage characteristic of a light-emitting diode that uses an electrode consisting of Mg/Pt layers and FIG. 17(b) is a graph showing the contact resistance value of the light-emitting diode.
Figure 17:
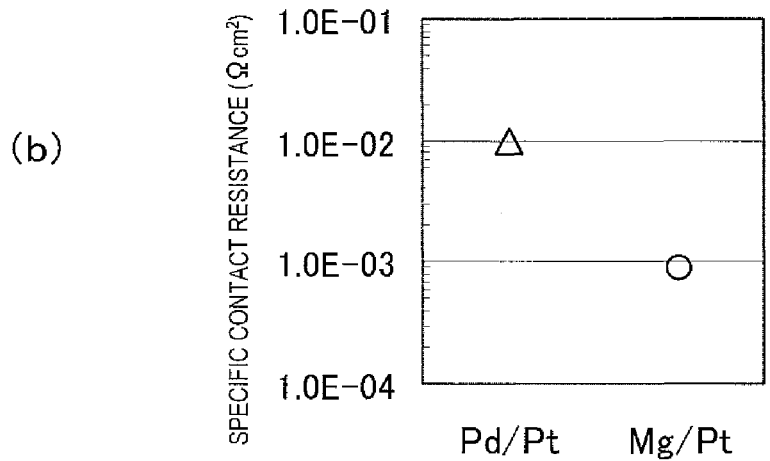

FIG. 17(a) shows the current-voltage characteristic of a light-emitting diode that uses an electrode consisting of Mg/Pt layers on m-plane GaN. For your reference, the characteristics of comparative light-emitting diodes that have the same LED nitride-based semiconductor structure but that use an electrode consisting of Pd/Pt layers and an electrode consisting of Mg/Pt layers on a c-plane GaN, respectively, are also shown in FIG. 17(a). The electrode structures and heat treatment conditions for these three types of light-emitting diodes are summarized in the following Table 4:

TABLE 4

| Plane orientation | p-electrode | Thickness (before heat treatment) | Heat treatment temperature and process time |
|---|---|---|---|
| m plane | Mg/Pt | 7 nm/75 nm | 600° C., 10 min. |
| m plane | Pd/Pt | 40 nm/35 nm | 500° C., 10 min. |
| c plane | Mg/Pt | 7 nm/75 nm | 600° C., 10 min. |

In each of these light-emitting diodes, an n-type GaN layer, an active layer in which three InGaN well layers and two GaN barrier layers are alternately stacked one upon the other, and a p-type GaN layer are stacked in this order on either an m-plane GaN substrate or a c-plane GaN substrate. In addition, on the p-type GaN layer, arranged as a p-electrode is either an Mg/Pt electrode or a Pd/Pt electrode. On the other hand, an n-electrode is formed on the n-type GaN layer by etching the p-type GaN layer and the active layer and exposing the n-type GaN layer.

As can be seen easily from FIG. 17(a), even if the voltage is increased from zero volts, the current value will still remain substantially zero for a while. However, once the applied voltage exceeds a certain level (which will be referred to herein as a "rise voltage"), the current value increases with the voltage. The electrode consisting of Pd/Pt layers (on the m-plane GaN) has a rise voltage of approximately 3.1 V. On the other hand, the electrode consisting of Mg/Pt layers (on the m-plane GaN) has a rise voltage of approximately 2.5 V, which is lower than the former one. It can be seen that the operating voltage resulting in a current value of 20 mA, which is shown in this drawing as an ordinate, was lower in the electrode consisting of the Mg/Pt layers by 1.5 volts or more than in the electrode consisting of the Pd/Pt layers.

Next, a light-emitting diode that uses an electrode consisting of Mg/Pt layers on m-plane GaN (which will be referred to herein as an "m-plane light-emitting diode") and a light-emitting diode that uses an electrode consisting of Mg/Pt layers on c-plane GaN (which will be referred to herein as a "c-plane light-emitting diode") will be compared to each other. The m-plane light-emitting diode had a lower rise voltage than the c-plane light-emitting diode, which allowed us to confirm that the contact resistance was certainly reduced. In the m-plane light-emitting diode, for example, a current value of 20 mA could be obtained for a drive voltage of 3.2 V. As for the c-plane light-emitting diode, on the other hand, a current value of 4.8 mA was achieved for the same drive voltage. Since the optical power of a light-emitting diode will depend on the current value, it can be seen that the optical power produced by the m-plane light-emitting diode was approximately four times as much as the one produced by the c-plane light-emitting diode at a drive voltage of 3.2 V.

Also, the gradient of the curve representing the current-voltage characteristic is steeper in the device with the Mg/Pt electrode than in the device with the Pd/Pt electrode. Generally speaking, a light-emitting diode is a diode that has a p-n junction inside. And a curve representing the current-voltage characteristic of a p-n junction diode is generally approximated by the following equation:

$$I = I_0 \exp(V/n \cdot KT)$$

where I is the value of current flowing through the p-n junction diode, $I_0$ is the current constant, V is the applied voltage, K is the Boltzmann constant, T is the temperature, and n is a value indicating the degree of idealness of the diode. Since the experiments were carried out at room temperature, KT=0.25 V.

The n value of a p-n junction diode is determined by the gradient of a curve representing the current-voltage characteristic. In an ideal p-n junction diode, n=1. In an actual p-n junction diode, however, the n value is different from one. But the closer to one the n value, the better. According to the results of experiments the present inventors carried out, n=1.4 in the device with the Mg/Pt electrode and n=2.2 in the device with the Pd/Pt electrode. As can be seen from these results, a good diode characteristic is realized by using the Mg/Pt electrode.

As shown in FIG. 17(b), the light-emitting diode with the electrode consisting of Mg/Pt layers had a contact resistance of $3.8 \times 10^{-4}$ $\Omega cm^2$. This is an amazing achievement because that low contact resistance on the order of $10^{-4}$ has never been achieved by a p-type m-plane GaN. The present inventors discovered that the power dissipation could be reduced significantly as a result. And we also discovered that our disclosure would have great technological significance for an m-plane GaN device. On the other hand, an electrode consisting of Pd/Pt layers had a contact resistance of approximately $1 \times 10^{-2}$ $\Omega cm^2$.

Figure 18:
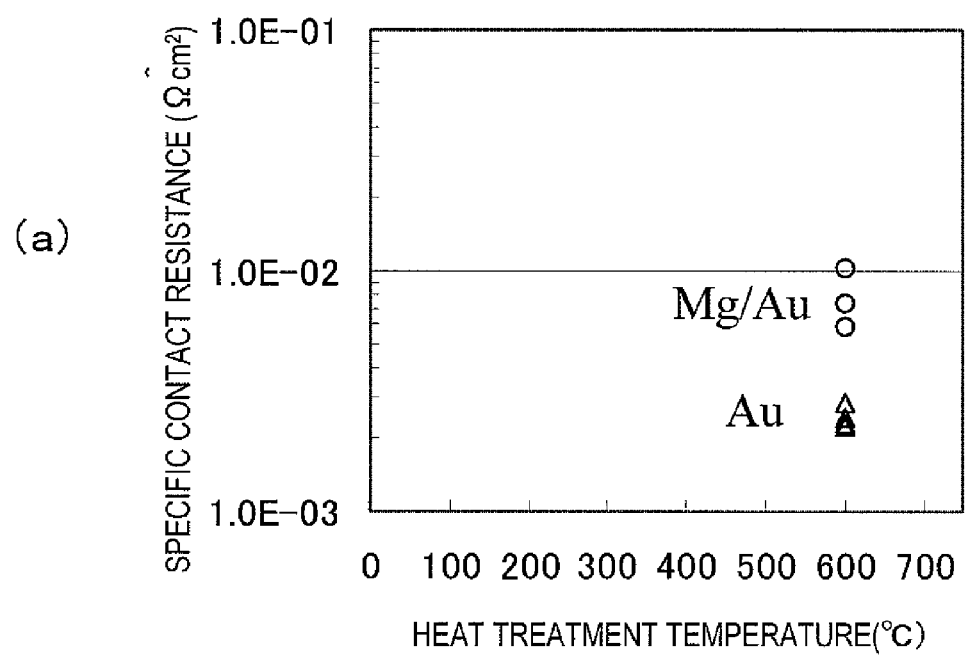
FIG. 18(a) is a graph showing the contact resistances of an electrode consisting of an Au layer and an electrode consisting of Mg/Au layers and FIGS. 18(b) and 18(c) are optical microscope photographs representing the surface of the electrode consisting of Mg/Au layers and that of the electrode consisting of an Au layer, respectively, as substitutes for drawings.
Figure 18:
Figure 18:
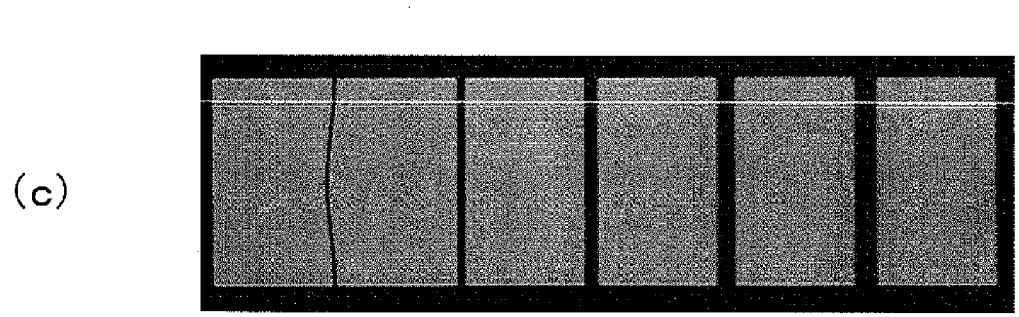

Next, examples that used an electrode consisting of an Au layer and an electrode consisting of Mg/Au layers will be described as comparative examples with reference to FIG. 18. Specifically, FIG. 18(a) shows the specific contact resistances ($\Omega \cdot cm^2$) of such an electrode consisting of an Au layer and such an electrode consisting of Mg/Au layers that were formed on an m-plane GaN layer. It should be noted that these specific contact resistances were measured after the electrode had been formed and thermally treated.

As can be seen from the results shown in FIG. 18(a), the specific contact resistance characteristic deteriorated with the electrode consisting of the Mg/Au layers compared to a situation where the electrode consisting of the Au layer was used. These results sharply disagree with the performance improvement achieved by an electrode with the structure of this embodiment (consisting of Mg/Pt layers, for example). As described above, Mg is an element that gets easily oxidized when exposed to water or the air. That is why not an electrode consisting of only an Mg layer but an electrode as a stack of Mg/Au layers is one of the structures that could be used. Actually, however, the contact resistance of the Mg/Au layers was higher than that of the Au layer, and therefore, the contact characteristic of the former structure was worse than that of the latter. In other words, considering that the results achieved by the stack of Mg and Au layers were unsatisfactory, the good contact resistance characteristic realized by the structure of this embodiment (consisting of Mg/Pt layers, for example) would have been a totally unexpected effect for those skilled in the art.

FIG. 18(b) is a photograph representing the surface of a thermally treated electrode consisting of Mg/Au layers as a substitute for a drawing, while FIG. 18(c) is a photograph representing the surface of a thermally treated electrode consisting of an Au layer as a substitute for a drawing. Comparing these photographs to each other, the present inventors discovered that the electrode consisting of the Mg/Au layers had inferior film quality to the electrode consisting of only the Au layer.

Figure 19:
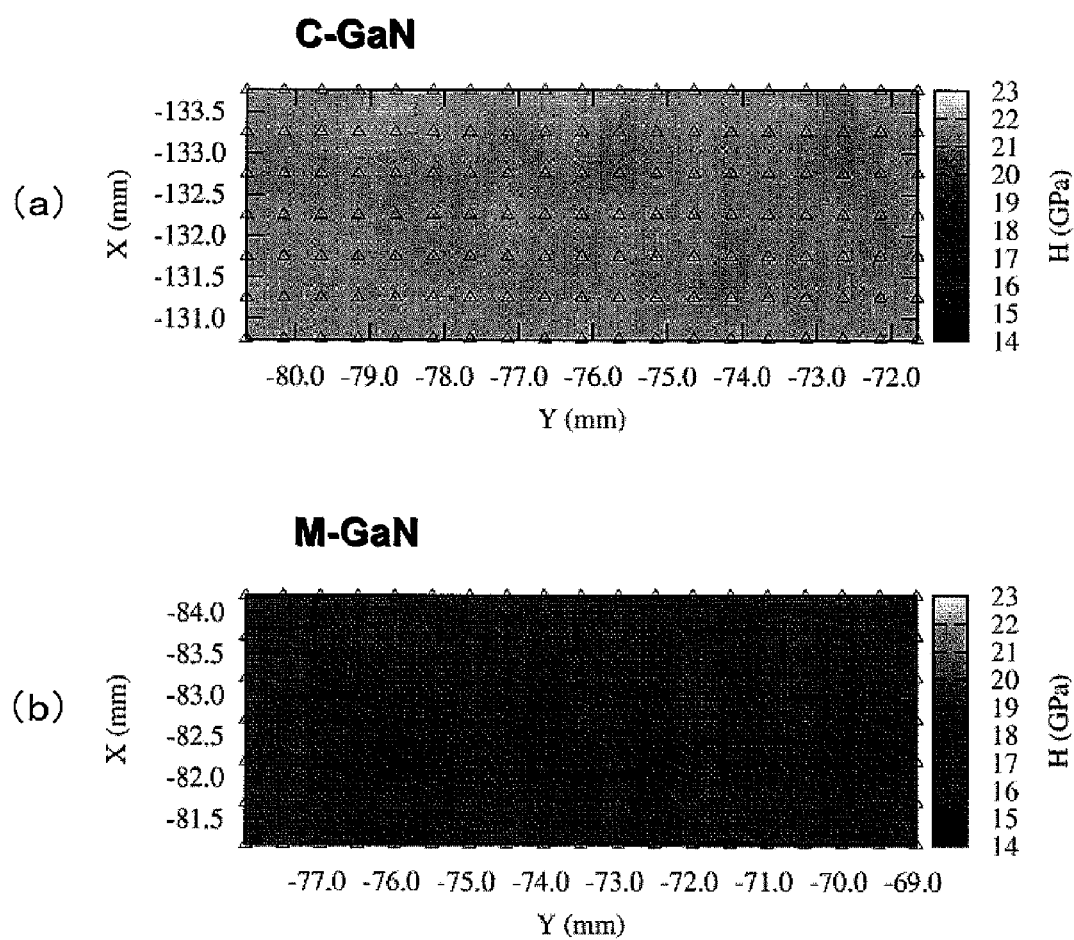
FIGS. 19(a) and 19(b) are graphs showing the results of hardness mapping that was carried out on a c-plane GaN substrate and an m-plane GaN substrate, respectively.

Next, look at FIG. 19, which illustrates the results of hardness mapping by a conical chip (5 mN, 1 μm conical). Specifically, FIG. 19(a) shows the results that were obtained on a c-plane GaN substrate (C—GaN), while FIG. 19(b) shows the results that were obtained on an m-plane GaN substrate (M-GaN). Comparing these results to each other, the present inventors discovered that the m-plane GaN substrate had lower hardness than the c-plane GaN substrate. Such a difference in physical property between the m- and c-plane GaN substrates could have affected the characteristic of the electrode structure (consisting of Mg/Pt layers, for example) of this embodiment.

While the present subject matter has been described with respect to the exemplary embodiments thereof, this subject matter is in no way limited to those specific embodiments but could be modified in numerous ways and may assume many embodiments other than those specifically described above.

Even though its structure is essentially different from the embodiment of the present disclosure, related structures are also disclosed in Japanese Patent Application Laid-Open Publication Nos. 8-64871 and 11-40846. However, those Japanese Patent Application Laid-Open Publication Nos. 8-64871 and 11-40846 do not mention at all that the crystallographic plane of their gallium nitride-based semiconductor layer is an m plane but just disclose a technique for forming an electrode on a c-plane gallium nitride-based semiconductor layer. More specifically, Japanese Patent Application Laid-Open Publication No. 8-64871 discloses a structure in which an Au layer is stacked on an Mg layer. And even if an electrode with such a multilayer structure were formed on an m plane, the effect of the electrode of this embodiment would never be achieved. Meanwhile, Japanese Patent Application Laid-Open Publication No. 11-40846 mentions metal layers of Ni, Cr and Mg but discloses only a specific example about an electrode structure that uses an Ni layer as the lower layer. Both of these Japanese Patent Application Laid-Open Publication Nos. 8-64871 and 11-40846 relate to an electrode structure that has been formed on a c-plane gallium nitride-based semiconductor layer and teach neither a problem nor a solution about the contact resistance with respect to an m-plane gallium nitride-based semiconductor layer.

The light-emitting device of the present disclosure described above could be used as it is as a light source. However, if the light-emitting device of the present disclosure is combined with a resin including a phosphor that produces wavelength conversion, for example, the device of the present disclosure can be used effectively as a light source with an expanded operating wavelength range (such as a white light source).

Figure 20:
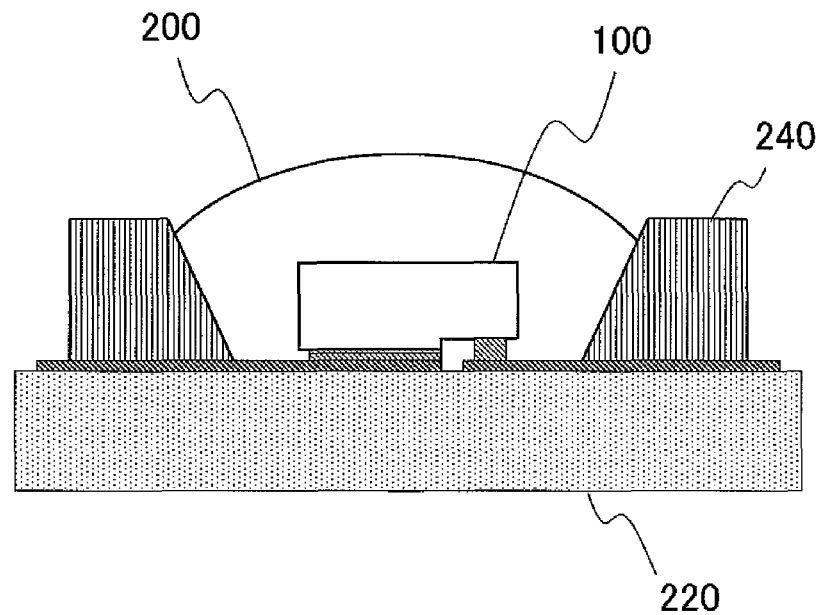
FIG. 20 is a cross-sectional view illustrating an embodiment of a white light source.

FIG. 20 is a schematic representation illustrating an example of such a white light source. The light source shown in FIG. 20 includes a light-emitting device 100 with the structure shown in FIG. 3(a) and a resin layer 200 in which particles of a phosphor such as YAG (yttrium aluminum garnet) are dispersed to change the wavelength of the light emitted from the light-emitting device 100 into a longer one. The light-emitting device 100 is mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

In the embodiments described above, the p-type semiconductor region that contacts with the Mg layer 32 is supposed to be made of GaN or AlGaN. However, the p-type semiconductor region could also be a layer including In such as InGaN. In that case, the contact layer to contact with the electrode 30 could be made of $In_{0.2}Ga_{0.8}N$ with an In mole fraction of 0.2, for example. If In is included in GaN, the bandgap of $Al_aGa_bN$ layer (where a+b=1, a≥0 and b>0) can be smaller than that of GaN, and therefore, the contact resistance can be reduced as a result. Consequently, the p-type semiconductor region that contacts with the Mg layer may be made of an $Al_xIn_yGa_zN$ (where x+y+z=1, x≥0, y≥0 and z≥0) semiconductor.

The effect of reducing the contact resistance can naturally be achieved by a non-LED light-emitting device (such as a semiconductor laser diode) or a device other than a light-emitting device (such as a transistor or a photodiode).

It should be noted that the surface (more particularly, the principal surface) of an actual m-plane semiconductor layer does not always have to be perfectly parallel to an m plane but may define a very small tilt angle (which is greater than 0 degrees but less than ±1 degree) with respect to an m plane. According to the manufacturing process technologies currently available, it is difficult to make a substrate or a semiconductor layer so that their surface is 100% parallel to an m plane. That is to say, if an m-plane substrate or an m-plane semiconductor layer is made by current manufacturing process technologies, the actual surface will slightly tilt with respect to the ideal m plane. However, as the tilt angle and tilt direction will vary from one manufacturing process to another, it is difficult to accurately control the tilt angle and tilt direction of the surface. In some cases, the surface (or the principal surface) of a substrate or a semiconductor layer is tilted intentionally by one degree or more with respect to an m plane. The gallium nitride-based compound semiconductor light-emitting device of the embodiment to be described below includes a p-type semiconductor region, of which the principal surface is tilted intentionally by one degree or more with respect to an m plane.

Other Embodiments

Figure 21:
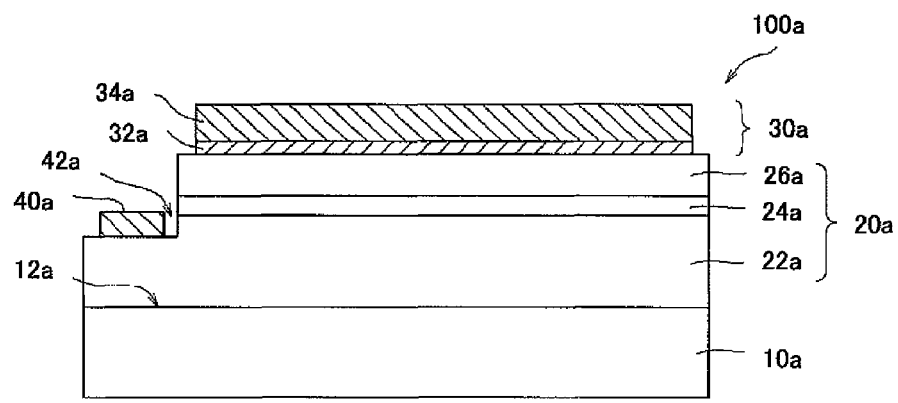
FIG. 21 is a cross-sectional view illustrating a gallium nitride-based compound semiconductor light-emitting device 100a as another embodiment of the present disclosure.
Figure 22:
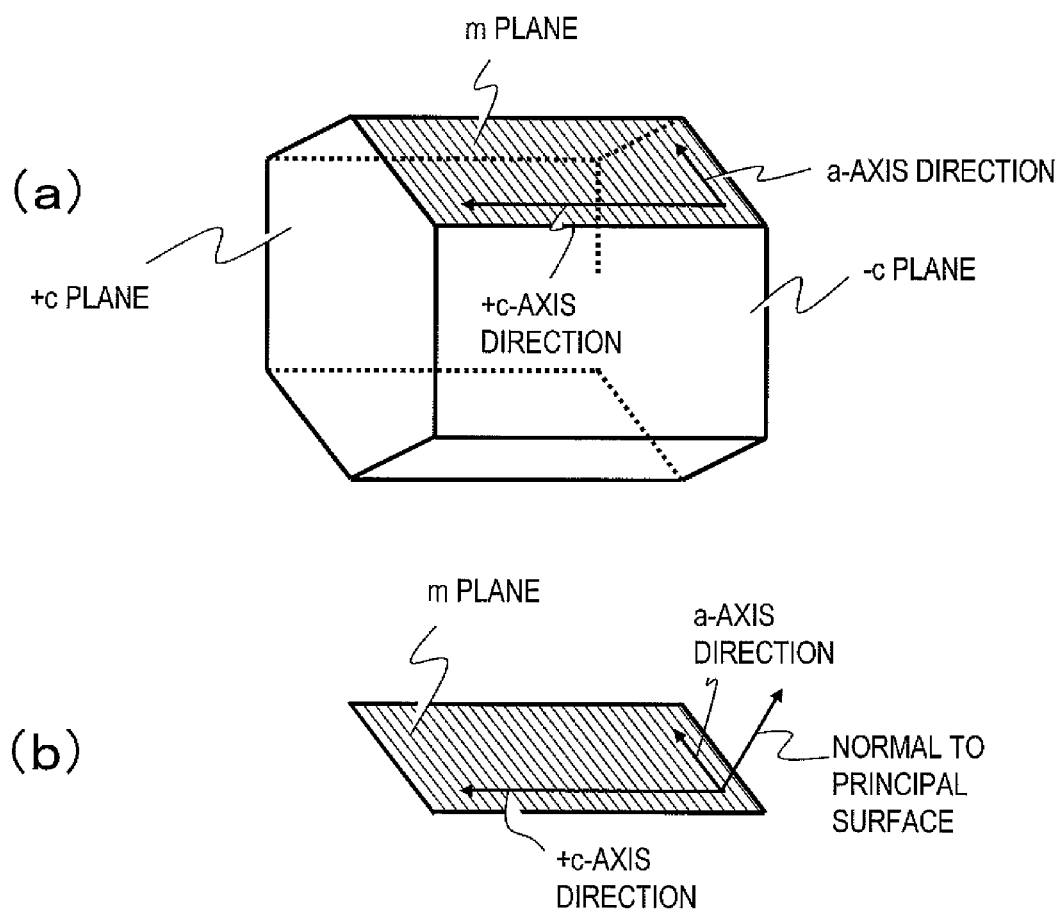
FIG. 22(a) schematically illustrates the crystal structure (i.e., the wurtzite crystal structure) of a GaN-based compound semiconductor
FIG. 22(b) is a perspective view illustrating the correlation between a normal to the m plane, the +c-axis direction and the a-axis direction.

FIG. 21 is a cross-sectional view illustrating a gallium nitride-based compound semiconductor light-emitting device 100a as another embodiment of the present disclosure. In order to form a p-type semiconductor region, of which the principal surface defines a tilt angle of one degree or more with respect to an m plane, the gallium nitride-based compound semiconductor light-emitting device of this embodiment uses a GaN substrate 10a which has a principal surface that defines a tilt angle of at least one degree with respect to an m plane. Such a substrate, of which the principal surface defines a tilt angle of at least one degree with respect to an m plane, is ordinarily called an "off-axis substrate". The off-axis substrate may be obtained by polishing the surface of a wafer that has been sliced off from a single crystal ingot so that its principal surface will be tilted intentionally in a particular direction with respect to an m plane. A semiconductor multilayer structure 20a is fabricated on this GaN substrate 10a. The principal surface of the semiconductor layers 22a, 24a and 26a shown in FIG. 21 defines a tilt angle of one degree or more with respect to an m plane. This is because if those semiconductor layers are stacked on such a tilted principal surface of the substrate, the surface (i.e., the principal surface) of those semiconductor layers also tilts with respect to an m plane. Optionally, the GaN substrate 10a may be replaced with a sapphire substrate or SiC substrate, of which the surface tilts in a particular direction with respect to an m plane.

Next, it will be described with reference to FIGS. 22 through 26 exactly how the p-type semiconductor region of this embodiment tilts.

Figure 2:
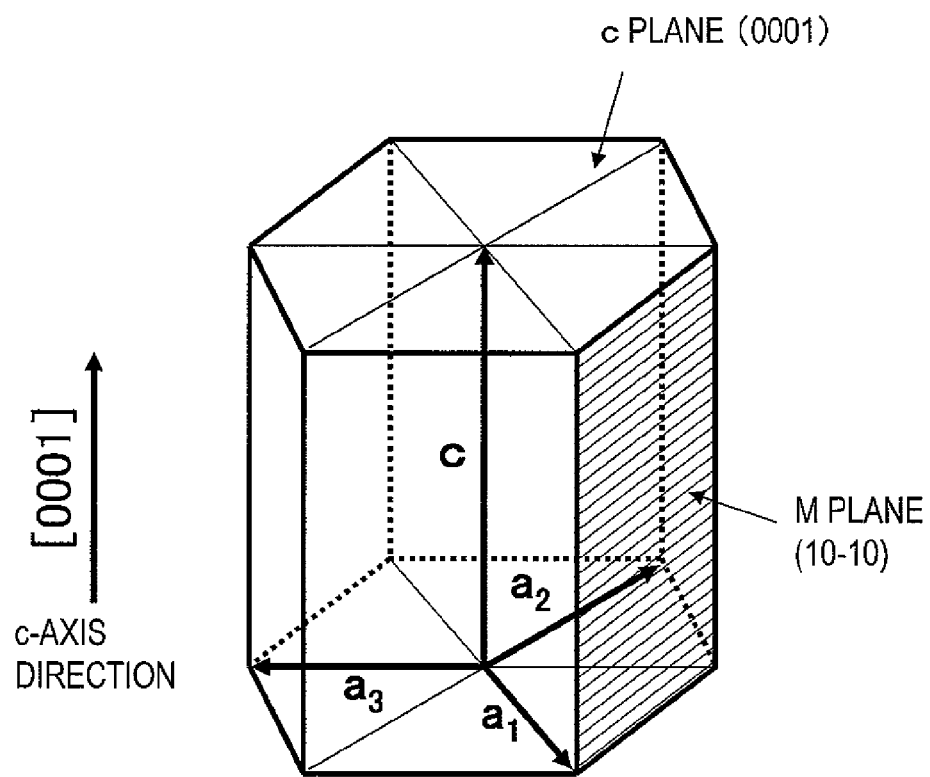
FIG. 2 is a perspective view showing four primitive vectors $a_1$, $a_2$, $a_3$ and c representing a wurtzite crystal structure.

FIG. 22(a) schematically illustrates the crystal structure (i.e., the wurtzite crystal structure) of the GaN-based compound semiconductor. The crystal structure will look as in FIG. 22(a) if its counterpart shown in FIG. 2 is rotated by 90 degrees. The c planes of a GaN crystal include +c planes and −c planes. Specifically, a +c plane is a (0001) plane on which Ga atoms are exposed, and is sometimes called a "Ga plane". On the other hand, a −c plane is a (000-1) plane on which N (nitrogen) atoms are exposed, and is sometimes called an "N plane". +c and −c planes are parallel to each other and both intersect with an m plane at right angles. Although c planes have polarities and can be classified into +c and −c planes in this manner, it would be meaningless to classify non-polar a planes into +a and −a planes.

The +c-axis direction shown in FIG. 22(a) is the direction that points perpendicularly from the −c plane toward the +c plane. On the other hand, the a-axis direction corresponds to the primitive vector $a_2$ shown in FIG. 2 and indicates [−12-10] directions that are parallel to the m plane. FIG. 22(b) is a perspective view illustrating the correlation between a normal to the m plane, the +c-axis direction and the a-axis direction. The normal to the m plane is parallel to [10-10] directions and intersects at right angles with both the +c-axis direction and the a-axis direction as shown in FIG. 22(b).

If the principal surface of a GaN-based compound semiconductor layer defines a tilt angle of at least one degree with respect to an m plane, it means that a normal to the principal surface of that semiconductor layer defines a tilt angle of at least one degree with respect to a normal to the m plane.

Figure 23:
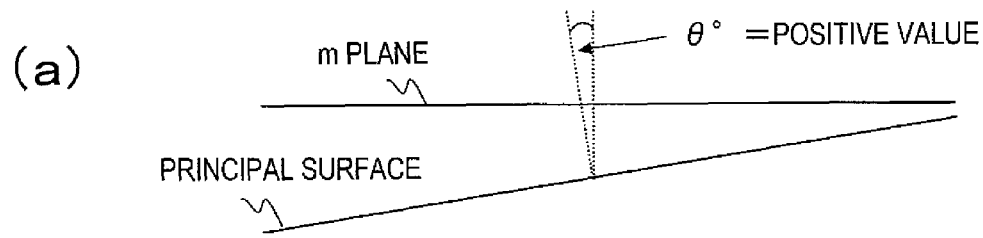
FIGS. 23(a) and 23(b) are cross-sectional views showing the relation between the principal surface of a GaN-based compound semiconductor layer and an m plane.
Figure 23:
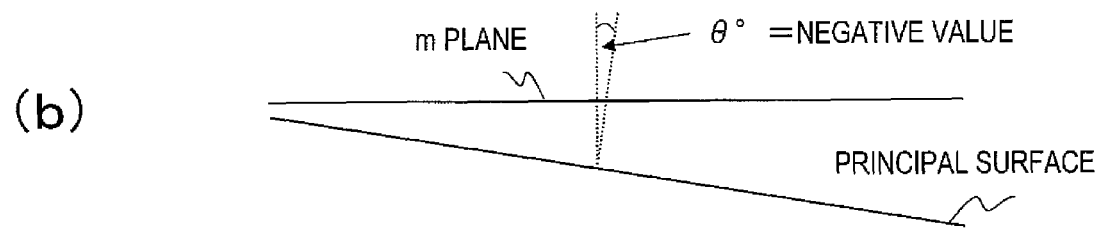
Figure 24:
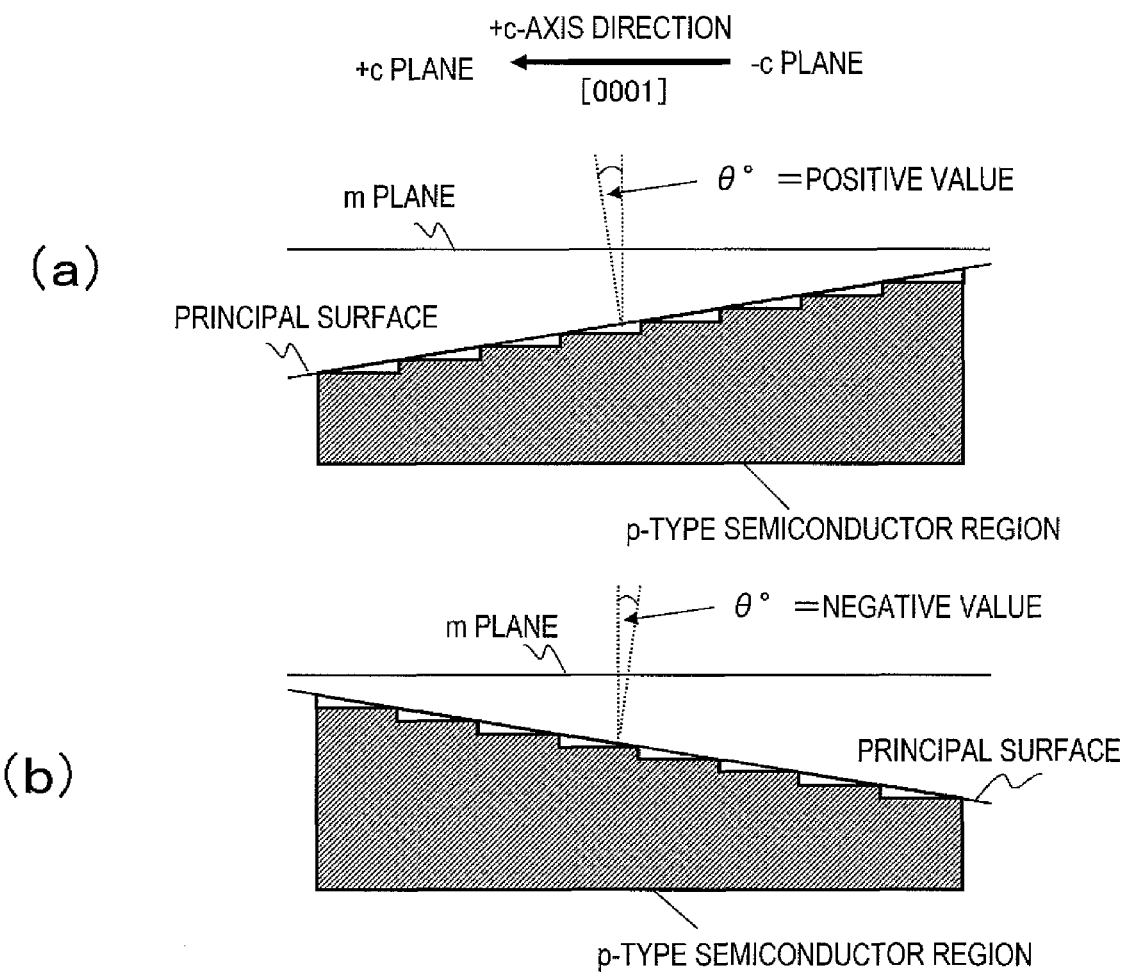
FIGS. 24(a) and 24(b) are cross-sectional views schematically illustrating the principal surface of a p-type GaN-based compound semiconductor layer and its surrounding region.

Next, turn to FIGS. 23(a) and 23(b), which are cross-sectional views showing the relation between the principal surface of a GaN-based compound semiconductor layer and an m plane as viewed on a plane that intersects with both the m plane and the c planes at right angles. In FIG. 23, shown is an arrow indicating the +c-axis direction. As shown in FIG. 23, the m plane is parallel to the +c-axis direction. And therefore, a vector representing a normal to the m plane (which will be simply referred to herein as an "m-plane normal vector") intersects with the +c-axis direction at right angles.

In each of the examples illustrated in FIGS. 23(a) and 23(b), a vector representing a normal to the principal surface (which will be simply referred to herein as the "principal surface normal vector") of the GaN-based compound semiconductor layer tilts in the c-axis direction with respect to the m-plane normal vector. More specifically, the principal surface normal vector tilts toward the +c plane in the example illustrated in FIG. 23(a) but tilts toward the −c plane in the example illustrated in FIG. 23(b). In this description, the tilt angle θ defined by the principal surface normal vector with respect to the m-plane normal vector is supposed to be positive and negative in the former and latter cases, respectively. In any case, it can be said that the principal surface is tilted in the c-axis direction.

According to this embodiment, as the tilt angle of the p-type semiconductor region falls within the range of 1 degree to 5 degrees or within the range of −5 degrees to −1 degree, the effect of the present disclosure can be achieved as significantly as in a situation where the tilt angle of the p-type semiconductor region is greater than 0 degrees but less than ±1 degree. The reason will be described with reference to FIGS. 24(a) and 24(b), which are cross-sectional views corresponding to FIGS. 23(a) and 23(b), respectively, and which illustrate the principal surface of the p-type semiconductor region that tilts in the c-axis direction with respect to an m plane and its surrounding region. If the tilt angle θ is 5 degrees or less, the principal surface of the p-type semiconductor region has a number of steps as shown in FIGS. 24(a) and 24(b). Those steps each have a height of 2.7 Å, which is as thick as a single atomic layer, and are arranged at substantially regular intervals of 30 Å or more. The principal surface with this arrangement of steps is certainly tilted overall with respect to the m plane but would actually have great many m-plane regions exposed on a microscopic scale.

Figure 25:
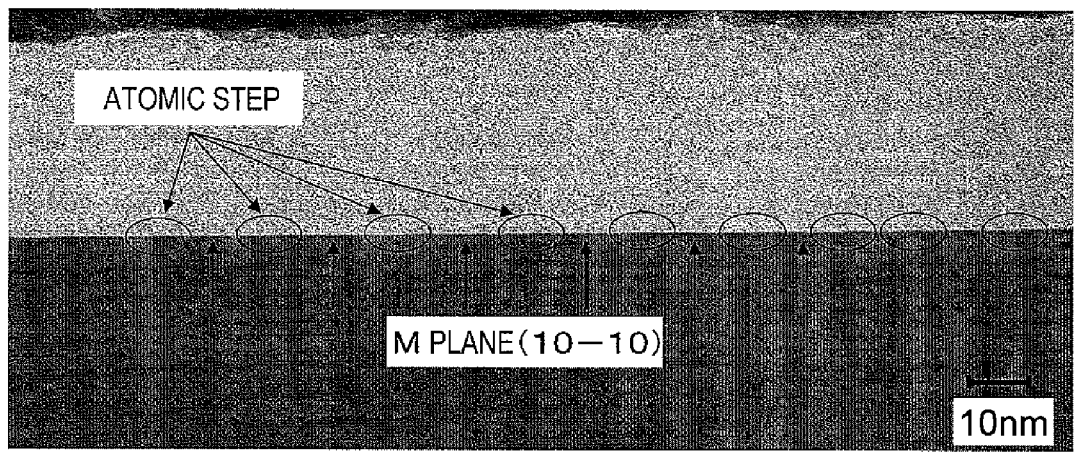
FIG. 25 is a cross-sectional TEM photograph of a p-type semiconductor region that defines a tilt angle of one degree in the −c axis direction with respect to an m plane.

FIG. 25 is a cross-sectional TEM photograph of such a p-type semiconductor region that defines a tilt angle of one degree in the −c axis direction with respect to an m plane. On the surface of the p-type semiconductor region, m planes exposed are easily recognizable. And it can be seen that those tilted surfaces are defined by atomic steps. The principal surface of the GaN-based compound semiconductor layer that is tilted with respect to the m plane has such a structure because m planes are much stabilized crystal planes in the first place. The same phenomenon would also be observed even if the principal surface normal vector tilts toward neither the +c plane nor the −c plane but faces any other direction. But the same can be said even if the principal surface normal vector tilts in the a-axis direction, for example, and if the tilt angle falls within the range of 1 to 5 degrees.

In view of these considerations, even if the surface (i.e., principal surface) of the p-type gallium nitride-based compound semiconductor layer defines a tilt angle of one degree or more with respect to an m plane, the contact resistance would not depend on the tilt angle because a lot of m-plane regions are exposed on the surface that contacts with the p-electrode.

Figure 26:
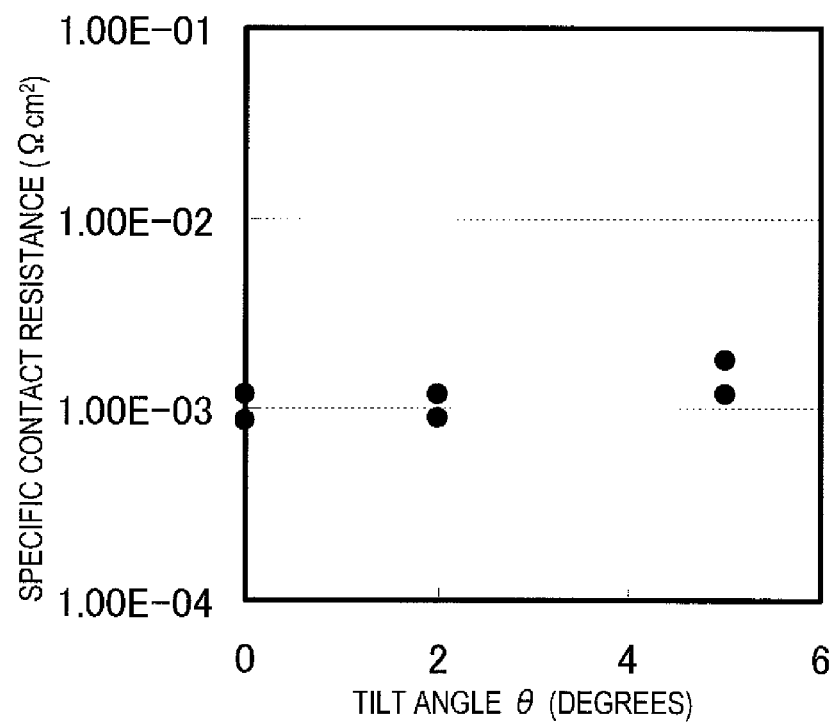
FIG. 26 is a graph showing the contact resistance ($\Omega \cdot cm^2$) of an electrode consisting of Mg/Pt layers that was formed on a p-type semiconductor region, of which the principal surface defined a tilt angle of 0, 2 or 5 degrees in the −c-axis direction with respect to an m plane.

The present inventors formed an electrode consisting of Mg/Pt layers on a p-type semiconductor region, of which the principal surface defined a tilt angle of 0, 2 or 5 degrees in the −c-axis direction with respect to an m plane and measured its contact resistance ($\Omega \cdot cm^2$). The results are shown in the graph of FIG. 26, of which the ordinate represents the specific contact resistance and the abscissa represents the tilt angle θ (i.e., the angle defined between a normal to an m plane and a normal to the surface of the p-type semiconductor region). This specific contact resistance was measured after an electrode had been formed and subjected to a heat treatment. As can be seen from the results shown in FIG. 26, if the tilt angle θ was 5 degrees or less, the contact resistance was substantially constant.

Based on these results, the present inventors confirmed that if the surface of the p-type semiconductor region had a tilt angle θ of 5 degrees or less, the contact resistance could be reduced by adopting the structure of the present disclosure.

It should be noted that if the absolute value of the tilt angle θ were greater than 5 degrees, then a piezoelectric field will be generated to decrease the internal quantum efficiency. If such a piezoelectric field were generated excessively, it would be much less meaningful to make a semiconductor light-emitting device by m-plane growth. For that reason, according to the present disclosure, the absolute value of the tilt angle θ is defined to be at most 5 degrees. Nevertheless, even if the tilt angle θ is set to be exactly 5 degrees, the actual tilt angle θ could be 5±1 degrees due to some variation involved with the real-world manufacturing process. It is difficult to totally eliminate such a variation involved with the manufacturing process and such a slight angular variation would never ruin the effect of the present disclosure and is negligible.

Even if the semiconductor light-emitting device of this embodiment is combined with a resin including a phosphor, for example, the device of the present disclosure can also be used effectively as a light source with an expanded operating wavelength range (such as a white light source).

The present disclosure may relate to a GaN-based semiconductor light-emitting device such as a light-emitting diode or a laser diode that operates at wavelengths over the entire visible radiation range, which covers the ultraviolet, blue, green, orange and white parts of the spectrum. Such a light-emitting device is expected to be applied to various fields of technologies including display, illumination and optical information processing in the near future.

According to the present disclosure, either a GaN-based semiconductor device, of which the crystals have been grown on an m-plane substrate, or a GaN-based semiconductor multilayer structure, of which the principal surface is an m plane, can have its contact resistance reduced. Consequently, the industrial applicability of such a GaN-based semiconductor device, of which the crystals have been grown on an m-plane substrate, or a GaN-based semiconductor multilayer structure, which the principal surface is an m plane, expands, although it has been difficult in the prior art to use with confidence such a semiconductor device or multilayer structure due to its poor contact resistance characteristic.

While the present invention has been described with respect to embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A nitride-based semiconductor device comprising:
a nitride-based semiconductor multilayer structure including a p-type semiconductor region; and
an electrode that is arranged on the p-type semiconductor region, wherein
the p-type semiconductor region is a GaN-based semiconductor made of an $Al_xIn_yGa_zN$ (where x+y+z=1, x≥0, y≥0 and z>0) semiconductor,
the p-type semiconductor region is a semiconductor layer that defines a tilt angle of at least one degree with respect to an m plane, an angle of 1 to 5 degrees being formed between a normal to a principal surface of the p-type semiconductor region and a normal to the m plane, the electrode is arranged on the principal surface of the p-type semiconductor region, the electrode includes an Mg layer, which is in contact with the principal surface of the p-type semiconductor region, and a metal layer formed on the Mg layer, the metal layer is formed from at least one metallic element that is selected from the group consisting of Pt, Mo and Pd, and the concentration of Ga in the Mg layer is higher than that of nitrogen in the Mg layer.

2. The nitride-based semiconductor device of claim 1, wherein an alloy layer, including Mg and the at least one metallic element selected from the group consisting of Pt, Mo and Pd, is sandwiched between the Mg layer and the metal layer.

3. The nitride-based semiconductor device of claim 1, wherein the Mg layer is made up of a film that is present on the principal surface of the p-type semiconductor region.

4. The nitride-based semiconductor device of claim 1, wherein the Mg layer is made up of islands of Mg portions that are distributed over the principal surface of the p-type semiconductor region.

5. The nitride-based semiconductor device of claim 1, wherein the nitride-based semiconductor multilayer structure has an active layer including an $Al_aIn_bGa_cN$ layer (where $a+b+c=1$, $a\geq0$, $b\geq0$ and $c\geq0$) and emitting light.

6. The nitride-based semiconductor device of claim 1, wherein the Mg layer has a thickness of 2 nm to 45 nm.

7. The nitride-based semiconductor device of claim 1, wherein the Mg layer has a thickness of 2 nm to 15 nm.

8. The nitride-based semiconductor device of claim 1, wherein the thickness of the Mg layer is equal to or smaller than that of the metal layer.

9. The nitride-based semiconductor device of claim 1, wherein the concentration of Ga is at least ten times as high as that of nitrogen.

10. The nitride-based semiconductor device of claim 1, further comprising a semiconductor substrate that supports the nitride-based semiconductor multilayer structure.

11. A light source comprising:
a nitride-based semiconductor light-emitting device; and
a wavelength conversion portion including a phosphor that changes the wavelength of the light emitted from the nitride-based semiconductor light-emitting device,
wherein the nitride-based semiconductor light-emitting device includes:
a nitride-based semiconductor multilayer structure including a p-type semiconductor region; and
an electrode that is arranged on the p-type semiconductor region, wherein
the p-type semiconductor region is a GaN-based semiconductor made of an $Al_xIn_yGa_zN$ (where $x+y+z=1$, $x\geq0$, $y\geq0$ and $z>0$) semiconductor,
the p-type semiconductor region is a semiconductor layer that defines a tilt angle of at least one degree with respect to an m plane, an angle of 1 to 5 degrees being formed between a normal to a principal surface of the p-type semiconductor region and a normal to the m plane,
the electrode is arranged on the principal surface of the p-type semiconductor region,
the electrode includes an Mg layer, which is in contact with the principal surface of the p-type semiconductor region, and a metal layer formed on the Mg layer, the metal layer is formed from at least one metallic element that is selected from the group consisting of Pt, Mo and Pd, and the concentration of Ga in the Mg layer is higher than that of nitrogen in the Mg layer.

12. A method for fabricating a nitride-based semiconductor device, the method comprising the steps of:
(a) providing a substrate;
(b) forming a nitride-based semiconductor multilayer structure, including a p-type semiconductor region, on the substrate, the p-type semiconductor region being a GaN-based semiconductor made of an $Al_xIn_yGa_zN$ (where $x+y+z=1$, $x\geq0$, $y\geq0$ and $z>0$) semiconductor, an angle of 1 to 5 degrees being formed between a normal to a principal surface of the semiconductor and a normal to an m plane; and
(c) forming an electrode on the principal surface of the p-type semiconductor region of the nitride-based semiconductor multilayer structure, wherein
the step (c) includes forming an Mg layer on the principal surface of the p-type semiconductor region and forming a metal layer, which is formed from at least one metallic element selected from the group consisting of Pt, Mo and Pd, after the Mg layer has been formed, and
the concentration of Ga in the Mg layer is higher than that of nitrogen in the Mg layer.

13. The method of claim 12, wherein the step (c) includes the step of subjecting the Mg layer to a heat treatment after the metal layer has been formed.

14. The method of claim 13, wherein the heat treatment is carried out at a temperature of 500° C. to 700° C.

15. The method of claim 14, wherein the heat treatment is carried out at a temperature of 550° C. to 650° C.

16. The method of claim 12, wherein the step of forming the Mg layer includes depositing Mg by evaporation onto the principal surface of the p-type semiconductor region by irradiating Mg with pulses of an electron beam.

17. The method of claim 13, comprising the step of setting the thickness of the Mg layer to be within the range of 2 nm to 45 nm after the heat treatment.

18. The method of claim 12, wherein the step (b) includes the step of forming an active layer including an $Al_xIn_yGa_zN$ (where $x+y+z=1$, $x\geq0$, $y\geq0$ and $z\geq0$) semiconductor.

19. The method of claim 12, comprising the step of removing the substrate after the step (b) has been performed.

20. The method of claim 12, wherein the concentration of Ga is at least ten times as high as that of nitrogen.

21. A nitride-based semiconductor device comprising:
a nitride-based semiconductor multilayer structure including a p-type semiconductor region that is made of a GaN-based semiconductor; and
an electrode that is arranged on the p-type semiconductor region, wherein
the p-type semiconductor region is made of an $Al_xIn_yGa_zN$ (where $x+y+z=1$, $x\geq0$, $y\geq0$ and $z>0$) semiconductor,
the p-type semiconductor region is a semiconductor layer that defines a tilt angle of at least one degree with respect to an m plane, an angle of 1 to 5 degrees being formed between a normal to the principal surface of the p-type semiconductor region and a normal to the m plane,
the electrode is arranged on the principal surface of the β-type semiconductor region,
the electrode includes an Mg layer and an alloy layer formed on the Mg layer,
the alloy layer includes Mg and at least one metallic element selected from the group consisting of Pt, Mo and Pd, and the concentration of Ga in the Mg layer is higher than that of nitrogen in the Mg layer.

22. A nitride-based semiconductor device comprising:
a nitride-based semiconductor multilayer structure including a p-type semiconductor region that is made of a GaN-based semiconductor; and
an electrode that is arranged on the p-type semiconductor region, wherein
the p-type semiconductor region is made of an $Al_xIn_yGa_zN$ (where x+y+z=1, x≥0, y≥0 and z>0) semiconductor,
the p-type semiconductor region is a semiconductor layer that defines a tilt angle of at least one degree with respect to an m plane, an angle of 1 to 5 degrees being formed between a normal to the principal surface of the p-type semiconductor region and a normal to the m plane,
the electrode is arranged on the principal surface of the p-type semiconductor region,
the electrode includes an Mg layer, which is in contact with the principal surface of the p-type semiconductor region, and a metal layer formed on the Mg layer,
the metal layer is formed from a metallic element that makes an alloy with Mg less easily than Au does, and
the concentration of Ga in the Mg layer is higher than that of nitrogen in the Mg layer.

23. The nitride-based semiconductor device of claim 1, wherein the p-type semiconductor region is made of GaN.

24. A light source comprising:
a nitride-based semiconductor light-emitting device; and
a wavelength conversion portion including a phosphor that changes the wavelength of the light emitted from the nitride-based semiconductor light-emitting device,
wherein the nitride-based semiconductor light-emitting device includes:
a nitride-based semiconductor multilayer structure including a p-type semiconductor region that is made of a GaN-based semiconductor; and
an electrode that is arranged on the p-type semiconductor region, wherein
the p-type semiconductor region is made of an $Al_xIn_yGa_zN$ (where x+y+z=1, x≥0, y≥0 and z>0) semiconductor,
the p-type semiconductor region is a semiconductor layer that defines a tilt angle of at least one degree with respect to an m plane, an angle of 1 to 5 degrees being formed between a normal to the principal surface of the p-type semiconductor region and a normal to the m plane,
the electrode is arranged on the principal surface of the p-type semiconductor region,
the electrode includes an Mg layer, which is in contact with the principal surface of the p-type semiconductor region, and a metal layer formed on the Mg layer,
the metal layer is formed from a metallic element that makes an alloy with Mg less easily than Au does, and
the concentration of Ga in the Mg layer is higher than that of nitrogen in the Mg layer.

25. The light source of claim 11, wherein the p-type semiconductor region is made of GaN.

26. A method for fabricating a nitride-based semiconductor device, the method comprising the steps of:
(a) providing a substrate;
(b) forming a nitride-based semiconductor multilayer structure, including a p-type semiconductor region that is made of a GaN-based semiconductor, on the substrate, the p-type semiconductor region being made of an $Al_xIn_yGa_zN$ (where x+y+z=1, x≥0, y≥0 and z>0) semiconductor, an angle of 1 to 5 degrees being formed between a normal to the principal surface of the semiconductor and a normal to an m plane; and
(c) forming an electrode on the principal surface of the p-type semiconductor region of the nitride-based semiconductor multilayer structure,
wherein the step (c) includes forming an Mg layer on the principal surface of the p-type semiconductor region and forming a metal layer, which is formed from a metallic element that makes an alloy with Mg less easily than Au does, after the Mg layer has been formed, and
the concentration of Ga in the Mg layer is higher than that of nitrogen in the Mg layer.

27. The method of claim 12, wherein the p-type semiconductor region is made of GaN.

* * * * *